United States Patent
Nitta

(10) Patent No.: US 8,181,141 B2
(45) Date of Patent: May 15, 2012

(54) DUMMY RULE GENERATING APPARATUS

(75) Inventor: Izumi Nitta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 245 days.

(21) Appl. No.: 12/659,758

(22) Filed: Mar. 19, 2010

(65) Prior Publication Data
US 2010/0287520 A1 Nov. 11, 2010

(30) Foreign Application Priority Data
May 7, 2009 (JP) .................. 2009-112742

(51) Int. Cl.
*G06F 17/50* (2006.01)
(52) U.S. Cl. ...................... 716/122; 716/126
(58) Field of Classification Search .................. 716/106, 716/111, 118–119, 122–126, 129–132, 135
See application file for complete search history.

(56) References Cited

U.S. PATENT DOCUMENTS

| | | | |
|---|---|---|---|
| 7,290,225 | B2 | 10/2007 | Tamura et al. |
| 8,024,673 | B2 | 9/2011 | Nitta |
| 2004/0083438 | A1 | 4/2004 | Ohba et al. |
| 2008/0179754 | A1 | 7/2008 | Hirbayashi |
| 2009/0246893 | A1 | 10/2009 | Fukuda |

FOREIGN PATENT DOCUMENTS
JP 09-081622 3/1997

OTHER PUBLICATIONS

Collins, G. et al., *Partial Cylindrical Algebraic Decomposition for Quantifier Elimination*, Reprinted from the Journal of Symbolic Computation, vol. 12, No. 3, 1991, pp. 299-328 (current pp. 174-200).
Anai, Hirokazu; Quantifier Elimination—Algorithm, Implementation and Applications:; IT core laboratory, Fujitsu Laboratories Ltd.; J. JSSAC (2003);vol. 10, No. 1 pp. 3-12.
Brown, Christopher W.; "An Overview of QEPCAD B: a Tool for Real Quantifier Elimination and Formula Simplification"; United States Naval Academy; J. JSSAC (2003);vol. 10, No. 1 pp. 13-22.
Anai, Hirokazu; "Parametric Robust Control by Quantifier Elimination"; J. JSSAC (2003);vol. 10, No. 1, pp. 41-51.
Office Action, emailed Feb. 2, 2011, in copending U.S. Appl. No. 12/494,740 (11 pp.).
U.S. Appl. No. 12/494,740, filed Jun. 30, 2009, Izumi Nitta, Fujitsu Limited of Kawasaki, Japan.

*Primary Examiner* — Stacy Whitmore
(74) *Attorney, Agent, or Firm* — Staas & Halsey LLP

(57) ABSTRACT

A dummy rule generating apparatus includes a critical pattern estimating unit that determines a wiring pattern whose total perimeter length of wirings is smaller than an appropriate range based on constraints on the wirings for a circuit layout as a critical pattern. The dummy rule generating apparatus also includes a rule generating unit that generates dummy fill rules of a shape and a layout of dummy metals that increase number of dummy metals inserted in the critical pattern and decrease the number of dummy metals inserted in a wiring pattern whose total perimeter length of wirings is within an appropriate range.

7 Claims, 21 Drawing Sheets

RULE SELECTION TABLE

| POSITION ON CRITICALITY MAP | RULE ID | CHARACTERISTIC OF RULE |
|---|---|---|
| A | RULE 0 | LARGE WIRING DENSITY INCREASE, AND SMALL WIRING PERIMETER LENGTH INCREASE |
| B | RULE 1 | LARGE WIRING DENSITY AND WIRING PERIMETER LENGTH INCREASE |
| C | RULE 2 | NO DUMMY FILL |
| D | RULE 3 | SMALL WIRING DENSITY INCREASE, AND LARGE WIRING PERIMETER LENGTH INCREASE |
| E | RULE 4 | LAYOUT CORRECTION NECESSARY |

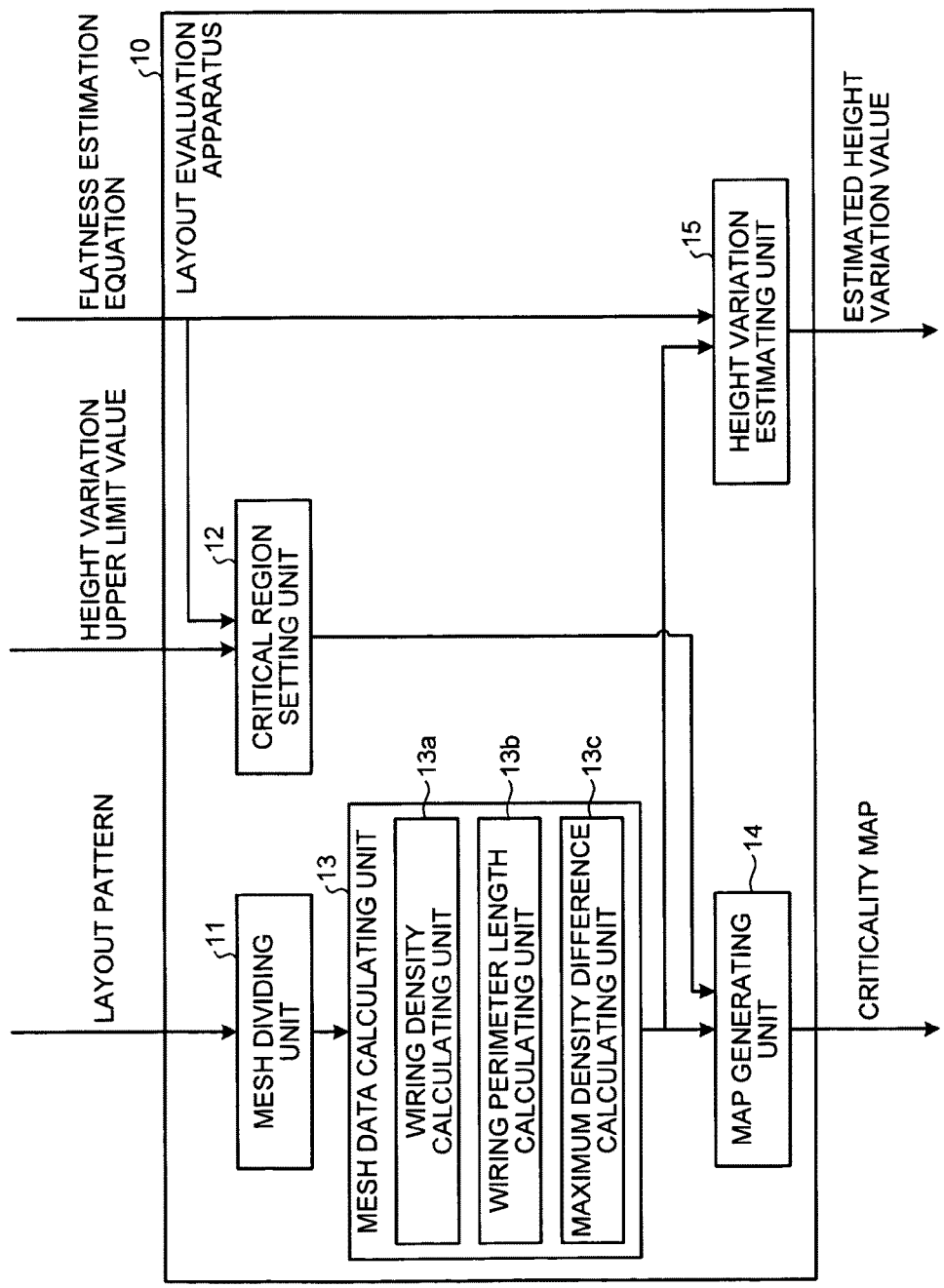

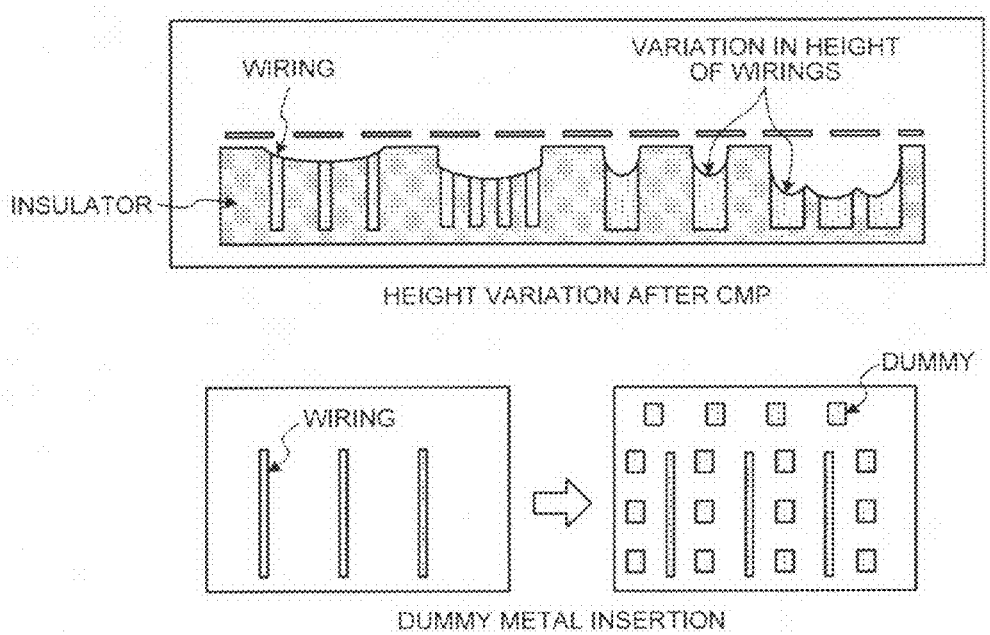
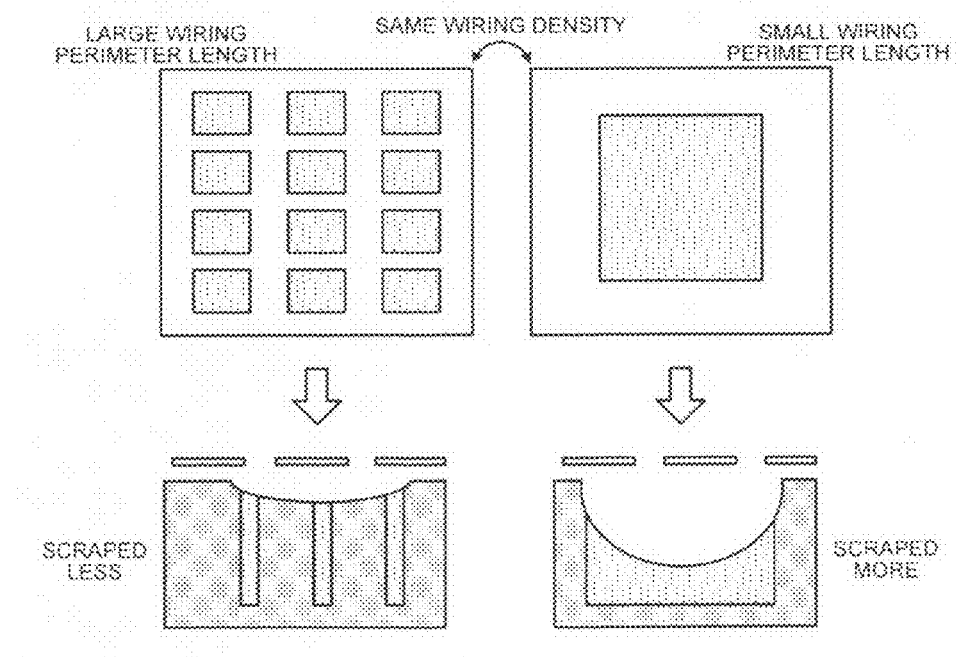

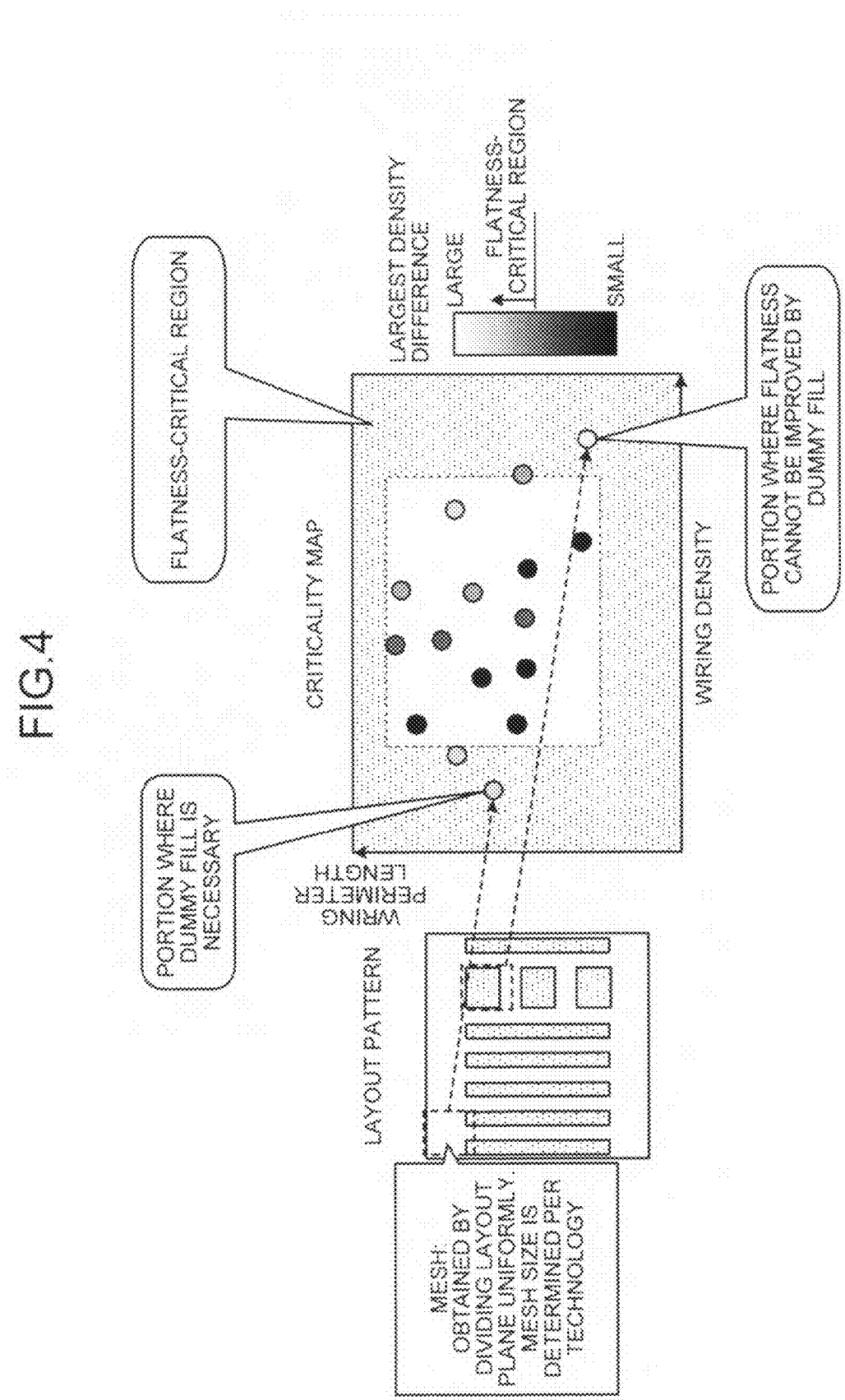

FIG.6

|  | CRITICALITY MAP | FLATNESS MAP |
|---|---|---|
| DISPLAY FLATNESS-CRITICAL PORTION (HOT-SPOT) | POSSIBLE | POSSIBLE |
| VISUALIZE FLATNESS | IMPOSSIBLE | POSSIBLE |
| VISUALIZE INDEX OF IMPROVEMENT IN FLATNESS | VISUALIZE HOW MUCH WIRING DENSITY AND WIRING PERIMETER LENGTH SHOULD BE IMPROVED | CANNOT BE KNOWN DIRECTLY FROM FLATNESS MAP |

FIG.8
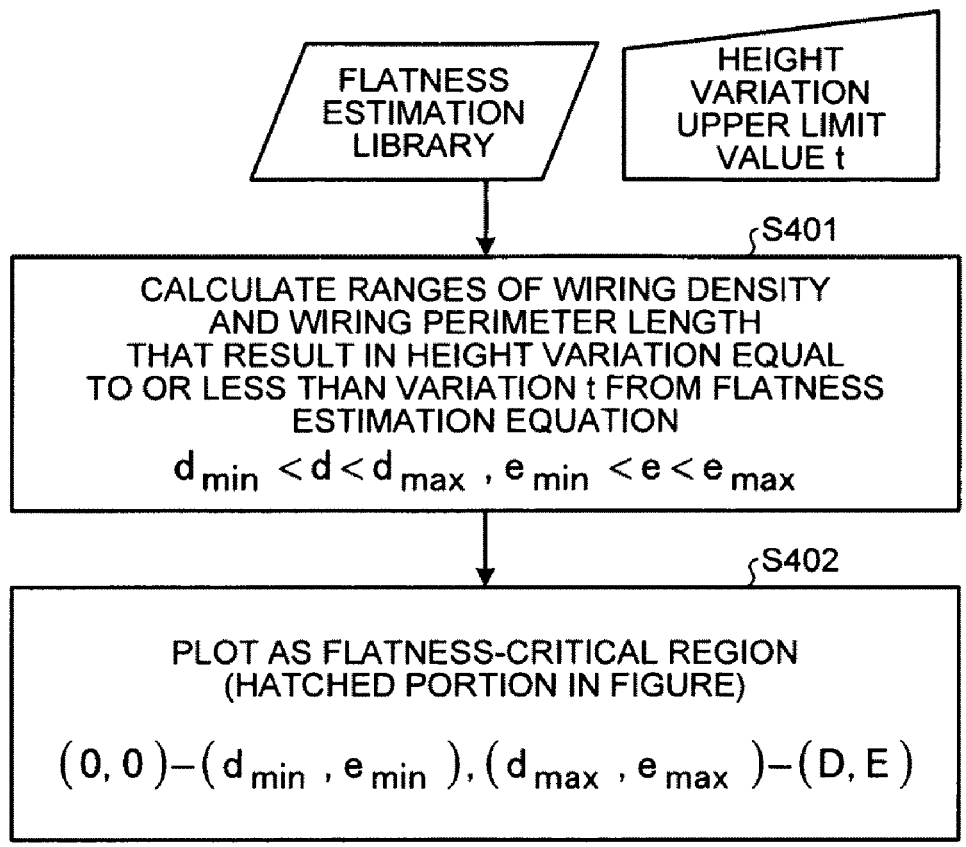
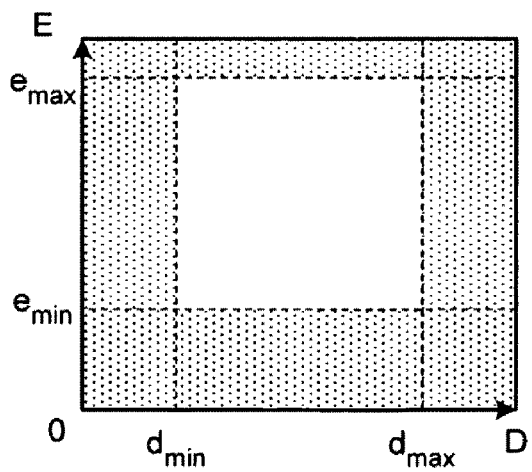

CALCULATION RESULT

```
Mesh
#ID X-COORDINATE Y-COORDINATE WIRING DENSITY
WIRING PERIMETER LENGTH
0 0 0 25 200;
1 0 1 30 200;
...
0 99 99 15 100;
END Mesh;
Density_critical_region
#ID SMALLEST VALUE   MAXIMUM VALUE
0 0 15;
1 85 100;
END Density_critical_region;
Edgelen_critical_region
#ID SMALLEST VALUE   MAXIMUM VALUE
0 0 10;
2 500 1000;
END Edgelen_critical_region;
DensitySlope_critical_region
0.65;
END DensitySlope_critical_region
```

FIG.15

```
RuleID 1;  #RULE NUMBER
Density 40; #MAXIMUM WIRING DENSITY
Edgelength 5000;#MAXIMUM WIRING PERIMETER LENGTH
Shape
#ID (LOWER LEFT COORDINATE, UPPER RIGHT COORDINATE)
0 0 500 500;
End Shape;
Pattern
#ID POSITION OF ORIGIN
0 0 15;
1 85 100;
END Pattern;
SpacingDummy  #SPACING BETWEEN DUMMIES
500;
End SpacingDummy:
SpacingWire #SPACING FROM WIRING
1000;
End SpacingWire;
```

FIG.17

| | RULE-BASED | MODEL-BASED | RULE-BASED +CRITICALITY MAP |
|---|---|---|---|
| OPTIMIZATION CAPABILITY | OPTIMIZATION CONSIDERING FLATNESS FOR EACH LAYOUT IS NOT POSSIBLE | OPTIMIZATION IS POSSIBLE BECAUSE CMP SIMULATION IS PERFORMED | PERFORMANCE EQUIVALENT TO MODEL-BASED CAN BE REALIZED BY PROVIDING PLURALITY OF RULES |
| FLATNESS ESTIMATION | CANNOT ESTIMATE WHEN APPLYING RULE, ADDITIONAL CMP SIMULATION IS NECESSARY | ESTIMATION IS POSSIBLE BECAUSE CMP SIMULATION IS PERFORMED | CAN ESTIMATE WHEN GENERATING CRITICALITY MAP |
| TAT | FAST | SLOW (TRADE-OFF FOR ACCURACY OF CMP SIMULATION) | INCREASE BY SEVERAL PERCENT COMPARED TO RULE-BASED BECAUSE CMP SIMULATION IS NOT PERFORMED |
| INFORMATION SHARING BETWEEN DESIGNING AND MANUFACTURING | SAME RULE IS VISIBLE | GENERALLY CMP SIMULATION AND DUMMY FILL ALGORITHM ARE INVISIBLE FROM MANUFACTURING BECAUSE THEY ARE BLACK-BOXED | RULE AND CRITICALITY MAP ARE VISIBLE |

FIG.21

| WIRING LAYER | DENSITY | DUMMY FILL RULE |
|---|---|---|
| 1 | 0 TO 20% | SQUARE, WIDTH 0.6, SPACING 0.6 |
| 1 | 20 TO 50% | SQUARE, WIDTH 0.5, SPACING 0.5 |
| 1 | 50 TO 80% | SQUARE, WIDTH 0.3, SPACING 0.2 |
| 2 | 0 TO 10% | SQUARE, WIDTH 1.5, SPACING 0.6 |
| 2 | 10 TO 40% | SQUARE, WIDTH 1.0, SPACING 0.5 |
| 2 | 40 TO 80% | SQUARE, WIDTH 0.5, SPACING 0.2 |

IF dw≥0.7, NO DUMMIES ARE INSERTED IN PATTERN WITH NON-CRITICAL EDGE LENGTH (WIRING SPACING≤2.04)

DUMMY RULE GENERATING APPARATUS

CROSS-REFERENCE TO RELATED APPLICATION

This application is based upon and claims the benefit of priority from Japanese Patent Application No. 2009-112742, filed on May 7, 2009, the entire contents of which are incorporated herein by reference.

FIELD

The embodiments discussed herein are directed to a dummy rule generating apparatus, and a dummy rule generating program for evaluating a layout of a semiconductor integrated circuit to be manufactured by estimating a processing result of a planarization step in a manufacturing process of the circuit.

BACKGROUND

Manufacturing of semiconductor integrated circuits involves generation of desired circuits by repeating exposure, etching, deposition (plating), and planarization (polishing) on wafers to construct laminate structures. Recently, miniaturization of such circuits has progressed and thus high precision fabrication has been demanded.

For example, a copper wiring that is recently mainstream is formed by electro-chemical plating (ECP) of generating wiring grooves on an insulator and plating the wiring grooves with copper to fill the wiring grooves with copper. However, in the ECP, not only the wiring grooves but also the entire surface of the insulator are covered with the copper plating, and thus chemical mechanical polishing or chemical mechanical planarization (CMP) is used in polishing to expose a wiring pattern.

If what is obtained as a result of CMP includes a height difference of wafer surface, i.e., variation of height, a short circuit in the wiring or the like may be caused due to a property variation in the copper wiring or residual copper, and performance and yield are thereby decreased.

Ease of scraping differs among different materials in the CMP. For example, by the CMP, the copper wiring is scraped to a greater extent than an insulating layer. To suppress the height variation resulting in the CMP, importance of equalizing a wiring density, i.e., a proportion of wiring to a chip area has been conventionally noted. The wiring density is also called a metal density because the wiring is formed of a metal.

Inserting dummy wirings or dummy fills is known as a technique of equalizing the wiring density, as proposed for example in Japanese Laid-open Patent Publication No. 09-081622. In this insertion of dummy fills, a dummy wiring is inserted in an area having a low wiring density, electrically independent from a genuine wiring. Therefore, the dummy wiring does not function as an electric wiring, and enables adjustment of the wiring density to thereby adjust an amount to be scraped off by the CMP without affecting an operation of a circuit formed of the genuine wiring.

Conventional insertions of dummy fills includes a rule-based insertion of dummy fills and a model-based insertion of dummy fills, which are different from each other in their methods of determining necessity of inserting dummy wirings, positions to insert the dummy wirings, an amount of insertion, and a form of insertion.

The rule-based insertion of dummy fills involves a method of determining insertion of a dummy wiring according to a predetermined dummy fill rule during or after designing of a circuit layout. In the rule-based insertion of dummy fills, a separate analysis by a CMP simulator is necessary for predicting flatness. Therefore, it is difficult to carry out an optimization taking the flatness into consideration for each circuit layout, but a turn-around-time (TAT) is short.

The model-based insertion of dummy fills involves a method of performing a CMP simulation during designing of a circuit layout and inserting a dummy wiring to optimize flatness. The CMP simulation is a technique of estimating a height variation (flatness) resulting from the CMP based on a polishing condition and a layout pattern. In the model-based insertion of dummy fills, it is possible to carry out an optimization taking flatness into consideration for each circuit layout by performing the CMP simulation, and also to estimate the flatness. However, the CMP simulation takes time. In other words, there is a trade-off relationship between obtaining the flatness precisely by the simulation to optimize a dummy arrangement and shortening the time required for designing.

In the conventional techniques, the flatness evaluation and optimization of the dummy fill rule for each circuit layout, and the processing speed have been incompatible with each other. Accordingly, it has been an important challenge to estimate the flatness in a TAT equivalent to that by the rule-based dummy fill insertion and obtain a dummy fill rule that can realize a flatness equivalent to that by the model-based insertion of dummy fills.

SUMMARY

According to an aspect of an embodiment of the present invention, a dummy rule generating apparatus includes a critical pattern estimating unit that determines a wiring pattern whose total perimeter length of wirings is smaller than an appropriate range based on constraints on the wirings for a circuit layout as a critical pattern, and a rule generating unit that generates dummy fill rules of a shape and a layout of dummy metals that increase number of dummy metals inserted in the critical pattern and decrease the number of dummy metals inserted in a wiring pattern whose total perimeter length of wirings is within an appropriate range.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 1 is a schematic diagram of a configuration of a layout evaluation apparatus according to an embodiment of the invention;

FIG. 2 is an explanatory diagram for a height variation after CMP and dummy insertion;

FIG. 3 is an explanatory diagram for an amount scraped that is dependent on wiring perimeter length;

FIG. 4 is an explanatory diagram for a criticality map generated by the layout evaluation apparatus;

FIG. 6 is an explanatory diagram comparing the criticality map and a flatness map;

FIG. 8 is an explanatory diagram for setting of a critical region;

FIG. 15 is an explanatory diagram for a data structure of the dummy fill rule;

FIG. 17 is an explanatory diagram for rule selection using the criticality map;

FIG. 21 is an explanatory diagram for specific examples of dummy fill rules generated by a dummy rule generating apparatus;

DESCRIPTION OF EMBODIMENT(S)

Figure 5:
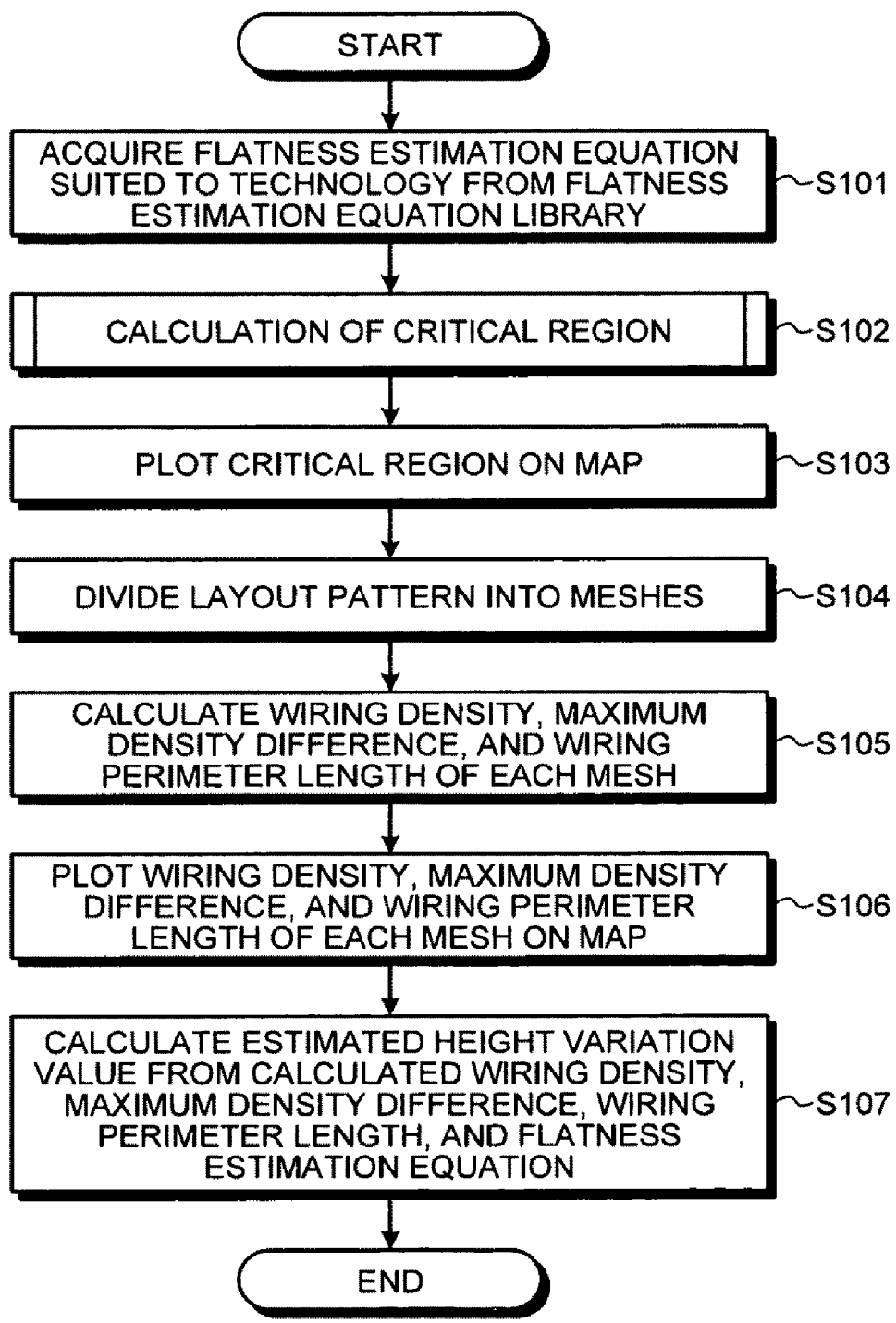
FIG. 5 is a flowchart for a processing operation of the layout evaluation apparatus.

Preferred embodiments of the present invention will be explained with reference to accompanying drawings.

[a] First Embodiment

FIG. 1 is a schematic diagram of a configuration of a layout evaluation apparatus according to an embodiment of the present invention. A layout evaluation apparatus 10 illustrated in FIG. 1 receives a layout pattern and evaluates a flatness the layout pattern would have if the layout pattern were subjected to CMP.

Ease of scraping in CMP differs among different materials. For example, copper wiring is scraped off more easily than an insulator. Accordingly, as illustrated in FIG. 2, when a first area having a high wiring density in which an area of copper wiring is larger than an area of an insulator and a second area having a low wiring density are both present, the first area is scraped off more, thereby causing a variation in a height of the wiring. Because the variation in the height of the wiring causes a variation in an electric property such as a higher resistance at a "lower" wiring, a dummy wiring is inserted to adjust an amount scraped off by CMP.

Recently, CMP simulation models and their precision have improved, and thus it has been found that not only a wiring density, but also a total perimeter length of wirings, i.e., a metal edge length, influence a flatness. FIG. 3 is an explanatory diagram for a difference in flatness of patterns having the same wiring density but different wiring perimeter length. As illustrated in FIG. 3, if the patterns have the same density, the one having a longer wiring perimeter length is scraped off less, and the one having a shorter wiring perimeter length is scraped off more.

Therefore, even if the wiring density is uniformized by using dummy fills, a variation in wiring perimeter length causes a height difference, and the flatness is decreased.

The layout evaluation apparatus 10 evaluates a flatness of a layout by dividing the layout pattern into meshes, and plotting each mesh on axes of wiring density and wiring perimeter length. FIG. 4 is an explanatory diagram for a flatness evaluation of a layout by the layout evaluation apparatus 10. As illustrated in FIG. 4, the layout evaluation apparatus 10 divides a layout plane of a circuit into partial areas by uniformly dividing the layout pattern into meshes. The size of a mesh is a value predetermined for each semiconductor manufacturing technology. The semiconductor manufacturing technology refers to a series of technologies used in each manufacturing process such as exposure, etching, deposition (plating), and planarization (polishing) which are determined based on a type of a circuit layout, which specifically may be a wiring width, and/or a wiring material.

The layout evaluation apparatus 10 obtains a wiring density and a total wiring perimeter length in each mesh, and plots them on the axes of wiring density and wiring perimeter length. Forms of displaying the plots, such as color, shape, and size, are preferably changed correspondingly with a maximum value of wiring density differences from adjacent meshes. A larger wiring density difference from an adjacent mesh indicates that the wiring density changes sharply. A sharp change in wiring density decreases the flatness. By representing the wiring density difference, in particular the maximum value of wiring density differences from a plurality of adjacent meshes, changing the forms of displaying the plots, an amount of information in each plot is increased, and more information on factors influencing the flatness of each mesh can be displayed.

The layout evaluation apparatus 10 plots on a map a range of wiring density and a range of wiring perimeter length within which the height variation expected from these ranges is larger than an upper limit value as a critical region, i.e., as a region in which the flatness is critical. Similarly, the layout evaluation apparatus 10 depicts on the map a range of the maximum density difference value within which the height variation expected from the range is larger than the upper limit value.

The layout evaluation apparatus 10 outputs a criticality map on which the wiring density, the wiring perimeter length, and the maximum density difference of each mesh, and a critical region of each parameter are all displayed. Accordingly, by referring to the criticality map, a mesh in the critical area, i.e., a mesh that causes a decrease in the flatness and that needs to be corrected with a dummy fill or the like can be identified. The critical area, depending on its position, includes a "position where a dummy fill is necessary", and/or a "position where the flatness cannot be improved with a dummy fill, and a layout correction is necessary". Accordingly, it is possible to judge which processing should be implemented depending on at which position in a critical area a mesh is plotted.

Specifically, the layout evaluation apparatus 10 includes, as illustrated in FIG. 1, a mesh dividing unit 11, a critical region setting unit 12, a mesh data calculating unit 13, a map generating unit 14, and a height variation estimating unit 15.

The mesh dividing unit 11 divides an input layout pattern into meshes, and outputs them to the mesh data calculating unit 13.

The mesh data calculating unit 13 calculates mesh data of each mesh, and includes therein a wiring density calculating unit 13a, a wiring perimeter length calculating unit 13b, and a maximum density difference calculating unit 13c. The wiring density calculating unit 13a calculates a wiring density of a mesh as one of the mesh data. Similarly, the wiring perimeter length calculating unit 13b calculates a total wiring perimeter length of a mesh as one of the mesh data. The maximum density difference calculating unit 13c calculates a maximum density difference of a mesh as one of the mesh data. The maximum density difference calculating unit 13c, specifically, uses a value of wiring density of each mesh calculated by the wiring density calculating unit 13a, compares a wiring density of a mesh with wiring densities of a plurality of adjacent meshes adjacent to that mesh, and sets the maximum value of wiring density differences as the maximum density difference.

The mesh data calculating unit 13 outputs the calculated mesh data, i.e., the wiring density, the wiring perimeter length, and the maximum density difference to the map generating unit 14 and the height variation estimating unit 15.

The critical region setting unit 12 sets ranges of wiring density, wiring perimeter length, and maximum density difference within which the height variation expected from these ranges is larger than an upper limit value as critical regions, based on the upper limit value of the height variation and a flatness estimation equation. The height variation upper limit value indicates an upper limit value allowed as a height variation resulting from CMP, and is specified by a user. The flatness estimation equation is an arithmetic expression for obtaining a height variation from a wiring density, a wiring perimeter length, and a maximum density difference.

The critical region setting unit 12 outputs the set critical regions to the map generating unit 14 and the height variation estimating unit 15.

The map generating unit 14 plots the critical regions set by the critical region setting unit 12 and the mesh data calculated by the mesh data calculating unit 13 on the same map to create a criticality map to be output.

The height variation estimating unit 15 estimates a height variation that would be generated upon execution of CMP on a layout pattern by substituting the wiring density, the wiring perimeter length, and the maximum density difference calculated by the mesh data calculating unit 13 in the flatness estimation equation. The estimated height variation value is an estimate value for the height variation of the input layout pattern, and an index of evaluation of the layout pattern.

FIG. 5 is a flowchart of a processing operation of the layout evaluation apparatus 10. As illustrated in FIG. 5, the layout evaluation apparatus 10 first acquires a flatness estimation equation suited to a technology of a layout pattern from a flatness estimation equation library (Step S101). The critical region setting unit 12 performs calculation of a critical region(s) using the flatness estimation equation and the height variation upper limit value (Step S102). The obtained critical region/regions is/are plotted on a map by the map generating unit 14 (Step S103).

The mesh dividing unit 11 divides the layout pattern into meshes (Step S104), and the mesh data calculating unit 13 calculates the wiring density, the maximum density difference, and the wiring perimeter length of each mesh (Step S105). The obtained wiring density, the maximum density difference, and the wiring perimeter length are plotted on the map by the map generating unit 14 (Step S106).

The height variation estimating unit 15 calculates the estimated height variation value based on the wiring density, the maximum density difference, the wiring perimeter length, and the flatness estimation equation (Step S107) to end the process.

FIG. 6 is an explanatory diagram comparing the criticality map generated by the layout evaluation apparatus 10 and a flatness map created by a CMP simulation. As listed in FIG. 6, the criticality map and the flatness map may both display a portion where the flatness is critical, i.e., a portion that causes the height variation to exceed a permissible range. The flatness map visualizes the flatness, but the criticality map does not visualize the flatness.

The index of flatness improvement that indicates a correction of which partial area will contribute largely to an improvement in the flatness is visualized in the criticality map, but it cannot be determined directly from the flatness map. In other words, the criticality map indicates an index of improvement in the flatness by using dummy fills or the like, and displays visually how much each of the wiring density and the wiring perimeter length needs to be improved to maintain the flatness within the permissible range.

Generation of a flatness estimation equation will be explained. The flatness estimation equation is generated per technology and stored in the flatness estimation equation library in advance, and is selectively used based on the technology of a layout pattern that is input.

Figure 7:
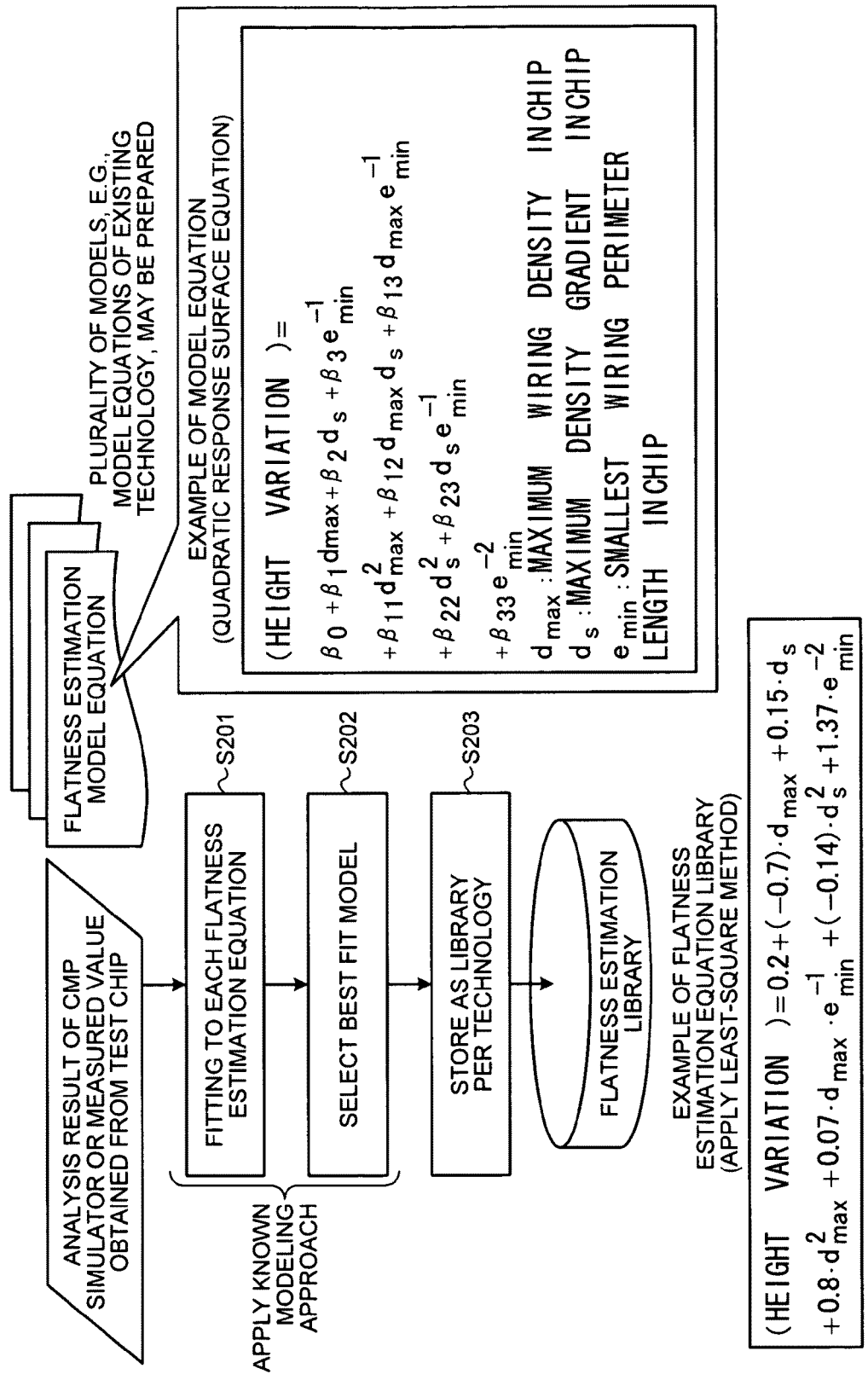
FIG. 7 is a flowchart for generating a flatness estimation equation.

FIG. 7 is an explanatory diagram for generation of the flatness estimation equation library. As illustrated in FIG. 7, flatness estimation equations corresponding to different semiconductor manufacturing technologies are each obtained per semiconductor manufacturing technology. A flatness estimation model having a highest coincidence found by comparing, for each semiconductor manufacturing technology, a value of flatness obtained by a CMP simulation or by actual measurements on a test semiconductor device with a plurality of flatness estimation models is obtained as each flatness estimation equation corresponding to the semiconductor manufacturing technology.

An example of the flatness model equation listed in FIG. 7 is a quadratic response surface equation, and is as follows:

$$\text{height variation} = \beta_0 + \beta_1 d_{max} + \beta_2 d_s + \beta_3 e_{min}^{-1} + \beta_{11} d_{max}^2 + \beta_{12} d_{max} d_s + \beta_{13} d_{max} e_{min}^{-1} + \beta_{22} d_s^2 + \beta_{23} d_s e_{min}^{-1} + \beta_{33} e_{min}^{-2}$$

where $d_{max}$ is the maximum value of wiring density in a chip, $d_s$ is the maximum value of gradient of wiring density in the chip, and $e_{min}$ is the smallest value of wiring perimeter length in the chip. Other various flatness estimation model equations also exist.

The value of flatness obtained by the CMP simulation or by actual measurements on the test semiconductor device are fitted into each flatness model equation (Step S201), the best fit model is selected (Step S202), and is stored in the library as the flatness estimation equation of that technology (Step S203). By repeating this process for each technology, a flatness estimation equation for each technology can be obtained.

For example, as a specific example of a flatness estimation equation to which the least-square method is applied, the following equation is stored in the library in FIG. 7.

$$\text{height variation} = 0.2 + (-0.7) \cdot d_{max} + 0.15 \cdot d_s + 0.8 \cdot d_{max}^2 + 0.07 \cdot d_{max} \cdot e_{min}^{-1} + (-0.14) \cdot d_s^2 + 1.37 \cdot e_{min}^{-2}$$

As illustrated in FIG. 8, the critical region setting unit 12 acquires a flatness estimation equation corresponding to the technology of the input layout pattern from the flatness estimation equation library, and obtains ranges of wiring density and wiring perimeter length that result in the height variation value equal to or lower than a height variation upper limit value t specified by a user, $d_{min}<d<d_{max}$, and $e_{min}<e<e_{max}$ (Step S401). A range outside $d_{min}<d<d_{max}$, and $e_{min}<e<e_{max}$, expressed herein as $(0, 0)-(d_{min}, e_{min})$, $(d_{max}, e_{max})-(D, E)$ is a critical region/regions of flatness. D is an upper limit value of wiring density, and E is an upper limit value of wiring perimeter length.

The map generating unit 14 plots on the map the critical region/regions $(0, 0)-(d_{min}, e_{min})$, $(d_{max}, e_{max})-(D, E)$ set by the critical region setting unit 12 (Step S402).

In calculating the critical regions, for example, a method of fixing two values of the maximum wiring density $d_{max}$ in the chip, the maximum density gradient $d_s$ in the chip, and the minimum wiring perimeter length $e_{min}$ in the chip and obtaining a range of the remaining one value from which an undesirable height variation is expected may be used. In this method, the determination as to the criticality is strict, but the critical region/regions can be obtained easily.

As a specific example, a process using the following flatness estimation equation will be explained with reference to FIG. 9.

$$\text{height variation}=0.2+(-0.7) \cdot d_{max}+0.15 \cdot d_s+0.8 \cdot d_{max}^2+0.07 \cdot d_{max} \cdot e_{min}^{-1}+(-0.14) \cdot d_s^2+1.37 \cdot e_{min}^{-2}$$

In this example, the height variation upper limit value t is 0.1, the ranges of parameters are:

$$d_{max}=\{10.1, 0.2, \ldots, 0.9\};$$

$$d_s=\{0.1, 0.2, \ldots, 0.8\}; \text{ and}$$

$$e_{min}=\{1, 10, 50, 100\}$$

and the following are constraints on the parameters.

$$0 \leq d_{max} \leq 1$$

$$0 \leq d_{max}-d_s \leq 1$$

$$e_{min} \geq 0.$$

Figure 9:
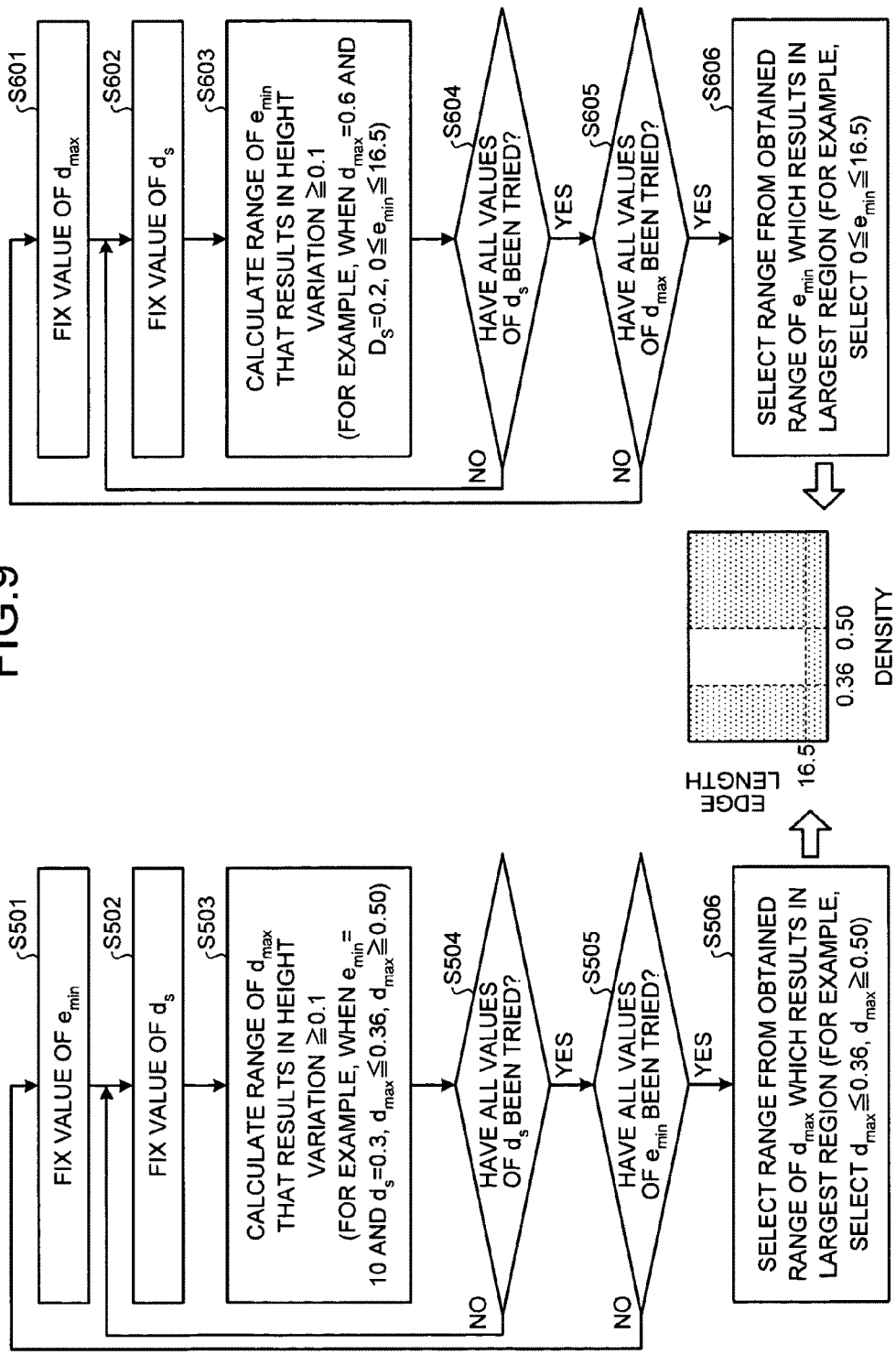
FIG. 9 is a flowchart for a specific method of calculating the critical region.

In FIG. 9, in the flow of obtaining a critical region of the wiring density $d_{max}$, the value of $e_{min}$ is fixed (Step S501), the value of $d_s$ is fixed (Step S502), and the range of $d_{max}$ which results in the height variation of 0.1 or larger is calculated (Step S503). For example, when $e_{min}=10$, and $d_s=0.3$, $d_{max} \leq 0.36$, and $d_{max} \geq 0.50$ can be obtained.

Thereafter, whether all values of $d_s$ have been tried is determined (Step S504), and if there is any value of $d_s$ that has not been tried (No at Step S504), the process returns to Step S502, and $d_s$ is fixed at another value.

If all the values of $d_s$ have been tried (Yes at Step S504), whether all values of $e_{min}$ have been tried is determined (Step S505), and if there is any value of $e_{min}$ that has not been tried (No at Step S505), the process returns to Step S501, and $e_{min}$ is fixed at another value.

If all the values of $e_{min}$ have been tried (Yes at Step S505), from the obtained range of $d_{max}$, a range that results in a largest region, for example, a range satisfying $d_{max} \leq 0.36$ and $d_{max} \geq 0.50$, is selected (Step S506).

Similarly, in a flow of obtaining a critical region of the wiring perimeter length $e_{min}$, a value of $d_{max}$ is fixed (Step S601), a value of $d_s$ is fixed (Step S602), and a range of $e_{min}$ that results in a height variation of 0.1 or larger is calculated (Step S603). For example, when $d_{max}=0.6$ and $d_s=0.2$, a range of $0 \leq e_{min} \leq 16.5$ can be obtained.

Thereafter, whether all values of $d_s$ have been tried is determined (Step S604), and if there is any value of $d_s$ that has not been tried (No at Step S604), the process returns to Step S602, and $d_s$ is fixed to another value.

If all the values of $d_s$ have been tried (Yes at Step S604), whether all the values of $d_{max}$ have been tried is determined (Step S605), and if there is any value of $d_{max}$ that has not been tried (No at Step S605), the process returns to Step S601, and $d_{max}$ is fixed to another value.

If all the values of $d_{max}$ have been tried (Yes at Step S605), from the obtained range of $e_{min}$, a range that results in a minimum region, for example, a range of $0 \leq e_{min} \leq 16.5$, is selected.

As another approach, a critical region may be calculated by using quantifier elimination based on a flatness estimation equation and a constraint on each parameter. (For quantifier elimination, see Hirokazu Anai, Quantifier Elimination—Algorithm/Implementation/Application—, Formula Manipulation J. JSSAC (2003) Vol. 10, No. 1, pp. 3-12; C. W. Brown, An Overview of QEPCAD B: a Tool for Real Quantifier Elimination and Formula Simplification, Formula Manipulation J. JSSAC (2003) Vol. 10. No. 1, pp. 13-22; and H. Anai and S. Hara, Parametric Robust Control by Quantifier Elimination, Formula Manipulation J. JSSAC (2003) Vol. 10, No. 1, pp. 41-51.)

Although a critical region can be obtained accurately by using quantifier elimination, it is required to determine whether a problem can be solved in a practical length of time. In order to solve the problem in the practical length of time, the estimation equation preferably is polynomial, has a small order, and has few variables.

Figures 10, 11:
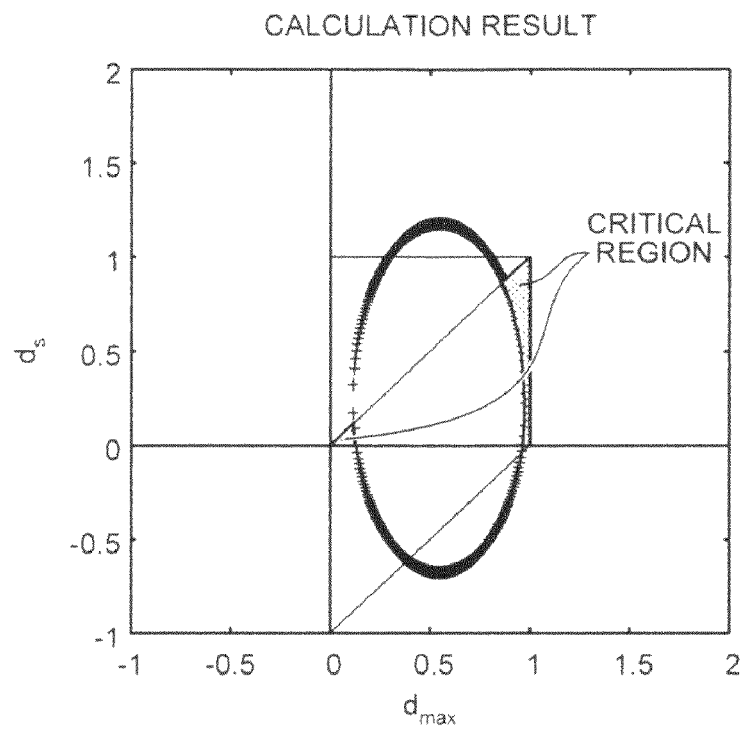
FIG. 10 is an explanatory diagram for a calculation result of the critical region when quantifier elimination is used.
FIG. 11 is an explanatory diagram for a data structure of the criticality map.

As a specific example, when the following flatness estimation equation is used, a critical region illustrated in FIG. 10 is obtained as a result of calculation.

$$\text{height variation}=0.2+(-0.7) \cdot d_{max}+0.15 \cdot d_s+0.8 \cdot d_{max}^2+(-0.14) \cdot d_s^2$$

In this example, the height variation upper limit value t is 0.1, and the following constraints on parameters are used.

$$0 \leq d_{max} \leq 1$$

$$0 \leq d_{max}-d_s \leq 1$$

$$e_{min} \geq 0$$

FIG. 11 is an explanatory diagram for an example of a data structure of a criticality map output by the map generating unit 14. As listed in FIG. 11, data of the criticality map include mesh data, critical region data for wiring density, critical region data for wiring perimeter length, and critical region data for maximum density difference.

The mesh data are described between "Mesh" and "END Mesh", and includes, as data, a mesh ID, an x-coordinate, a y-coordinate, a wiring density, and a wiring perimeter length. The critical region data for wiring density are described between "Density_critical_region" and "END Density_critical_region", and includes, as data, a critical region ID for wiring density, and the minimum value and the maximum value of the wiring density of the critical region. The critical region data for wiring perimeter length are described between "Edgelen_critical_region" and "END Edgelen_critical_region", and includes, as data, a critical region ID of the wiring perimeter length, and the minimum value and the maximum value of the wiring perimeter length of the critical region. The critical region data for maximum density difference is described between "DensitySlope_critical_region" and "END DensitySlope_critical_region", and includes, as data, the minimum value of the critical region of the maximum density difference.

The height variation estimating unit 15 estimates a height variation of an input layout pattern by substituting the wiring density, the wiring perimeter length, and the maximum density difference calculated by the mesh data calculating unit 13 into the flatness estimation equation.

For example, if the flatness estimation equation corresponding to the technology of the input layout pattern is:

$$\text{height variation} = 0.1914 + (-0.8068) \cdot d_{max} + 0.1396 \cdot d_s + 0.7795 \cdot d_{max}^2 + 0.0677 \cdot d_{max} \cdot e_{min}^{-1} + (-0.1371) \cdot d_s^2 + (-0.0281) \cdot e_{min}^{-2},$$

and $d_{max}$, $d_s$, and $e_{min}$ calculated by the mesh data calculating unit 13 are 0.75, 0.55, and 500, respectively, the value of height variation is 0.06.

The layout evaluation apparatus 10 obtains the ranges of wiring density, wiring perimeter length, and maximum density difference within which the resulting height variation would be equal to or under a specified upper limit if the layout pattern were subjected to CMP, as critical regions. The input layout pattern is divided into meshes, and the wiring density, wiring perimeter length, and maximum density difference are calculated for each mesh as mesh data. A criticality map indicating whether the mesh data of each mesh is in the critical regions and an estimated value of the height variation of the entire pattern are calculated.

Accordingly, it becomes possible to perform the flatness evaluation for each circuit layout at a high speed, and to visualize which part requires a dummy fill and a layout correction.

It may be determined how to place dummy fills for a mesh that requires correction based on the criticality map and the estimated height variation value.

Figure 12:
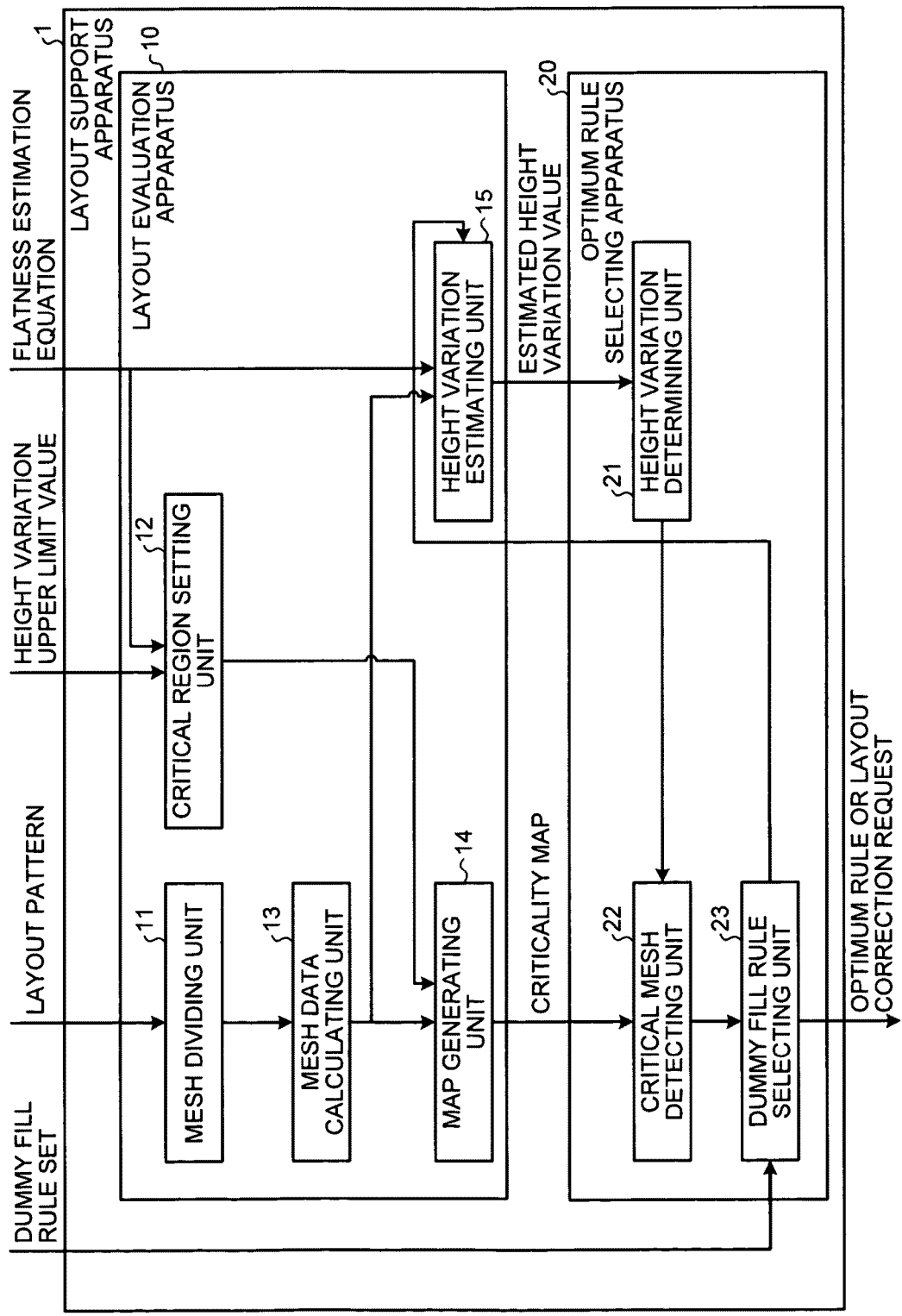
FIG. 12 is a schematic diagram of a configuration of a layout support apparatus that selects a dummy fill rule.

FIG. 12 is a schematic diagram of a configuration of a layout support apparatus 1 that supports a circuit layout by automatically selecting a target on which a dummy fill is applied, and a dummy fill rule to be applied.

The layout support apparatus 1 illustrated in FIG. 12 includes the layout evaluation apparatus 10 and an optimum rule selecting apparatus 20 connected to each other. The optimum rule selecting apparatus 20 includes therein a height variation determining unit 21, a critical mesh detecting unit 22, and a dummy fill rule selecting unit 23.

The height variation determining unit 21 compares an estimated height variation value output by the layout evaluation apparatus 10 with the height variation upper limit value to determine their magnitude relation.

If the estimated height variation value is equal to or larger than the upper limit value, the critical mesh detecting unit 22 detects a mesh that is a cause of the estimated height variation value being equal to or larger than the upper limit value, i.e., a mesh having any of its mesh data in the critical regions as a critical mesh.

The dummy fill rule selecting unit 23 selects a dummy fill rule optimum for each critical mesh, i.e., a rule of inserting a dummy wiring. The dummy fill rule is selected from a set of a plurality of dummy fill rules.

Figure 13:
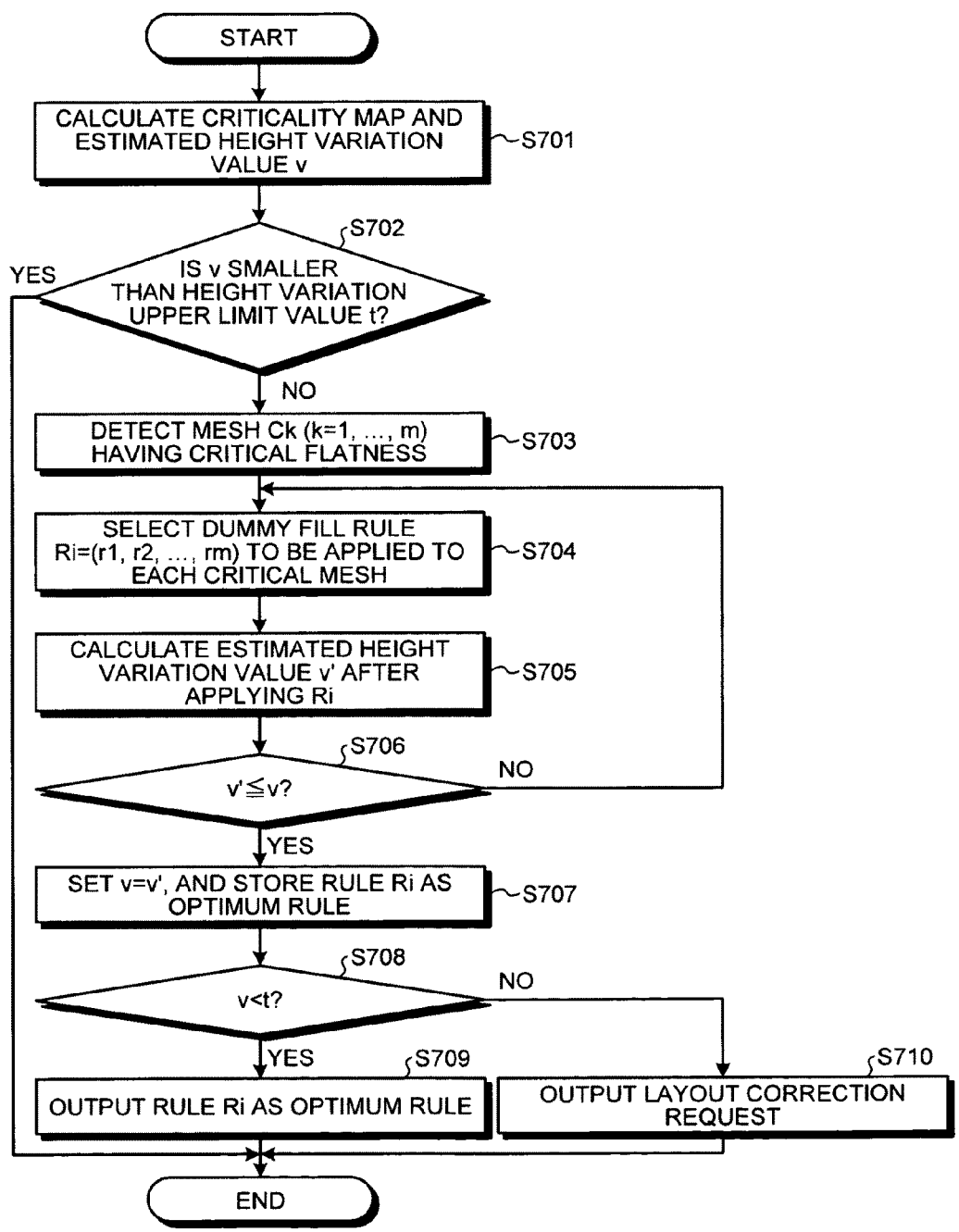
FIG. 13 is a flowchart for a processing operation of the layout support apparatus.

FIG. 13 is a flowchart of a processing operation of the layout support apparatus 1. As illustrated in FIG. 12, the layout support apparatus 1 calculates a criticality map and an estimated height variation value v using the layout evaluation apparatus 10 (Step S701). The height variation determining unit 21 inside the optimum rule selecting apparatus 20 determines whether the estimated height variation value v is smaller than a height variation upper limit value t (Step S702). If v<t (Yes at Step S702), the input layout pattern is appropriate, and the process ends.

If v≧t (No at Step S702), the critical mesh detecting unit 22 detects a mesh group Ck (k=1, . . . , m) having critical flatness (Step S703).

The dummy fill rule selecting unit 23 selects a dummy fill rule Ri (r1, r2, . . . , rm) to be applied to each critical mesh (Step S704).

Thereafter, the layout evaluation apparatus 10 calculates an estimated height variation value v' for each critical mesh to which the dummy fill rule Ri has been applied (Step S705). The optimum rule selecting apparatus 20 compares v with v' (Step S706), and if v' is larger than v (No at Step S706), the process proceeds to Step S704 again, and a dummy fill rule is selected again.

If v' is equal to or less than v (Yes at Step S706), v' is set as v, and the rule Ri is stored as the optimum rule (Step S707). Upon comparing v and t, if v<t (Yes at Step S708), the rule Ri is output as the optimum rule (Step S709), and the process ends. If v≧t (No at Step S708), the layout correction request is output, and the process ends.

Figure 14:
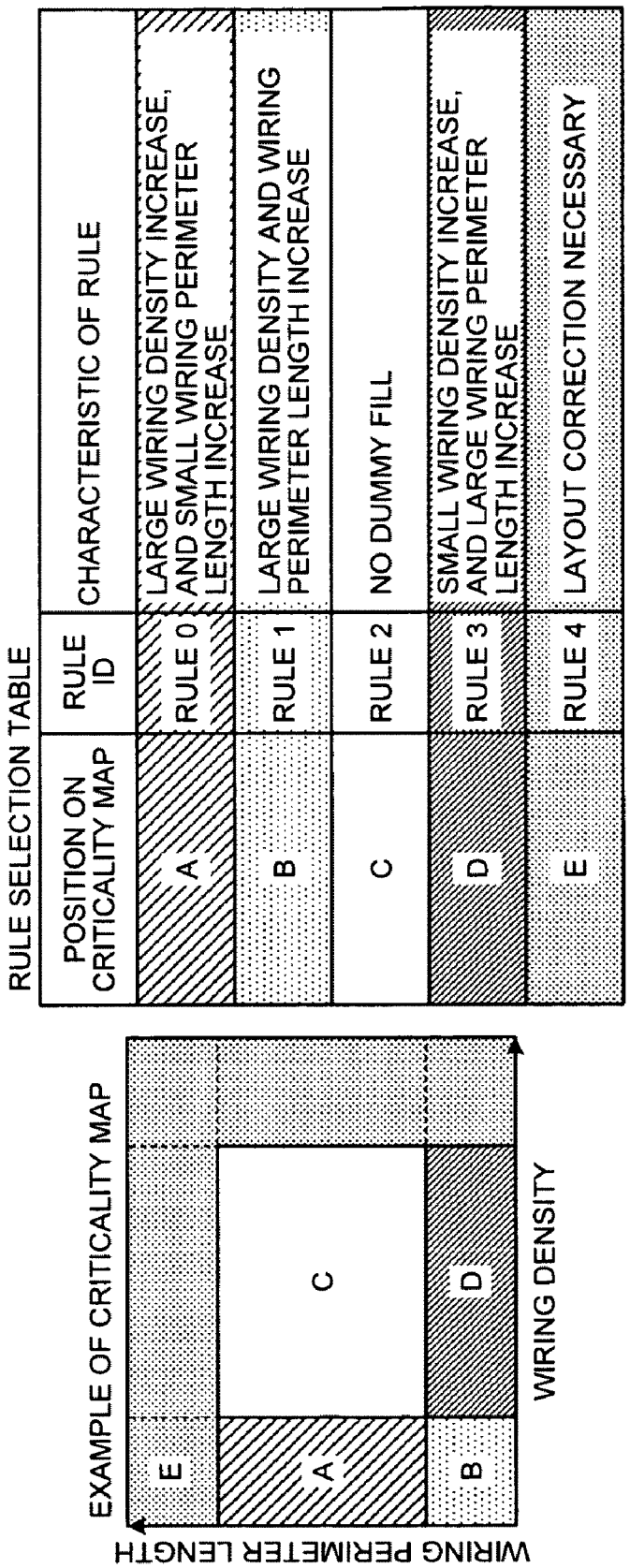
FIG. 14 is an explanatory diagram for selection of the dummy fill rule.

With reference to FIG. 14, a specific example of rule selection will be explained. In the example in FIG. 14, the criticality map is divided into fives areas A to E. The area A is where the wiring perimeter length is within an appropriate range, and the wiring density is smaller than an appropriate range. The area B is where both the wiring density and wiring perimeter length are smaller than the appropriate ranges. The area C is where both the wiring density and wiring perimeter length are within the appropriate ranges. The area D is where the wiring density is within the appropriate range, and the wiring perimeter length is smaller than the appropriate range. The area E is where either the wiring perimeter length or the wiring density is larger than the appropriate range therefor.

The dummy fill rule selecting unit 23 refers to a rule selection table based on which of the areas A to E a mesh is plotted in, and selects a rule from the dummy fill rule set. The dummy fill rule set includes five rules 0 to 4. As indicated in the rule selection table, the areas A to E correspond to the rules 0 to 4.

Specifically, the area A is associated with the rule 0 that defines a large increase in the wiring density and a small increase in the wiring perimeter length. The area B is associated with the rule 1 that defines large increases in both the wiring density and the wiring perimeter length. The rule 2 associated with the area C indicates that dummies are not inserted. The area D is associated with the rule 3 that defines a small increase in the wiring density, and a large increase in the wiring perimeter length. The area E associated with the rule 4 indicates that correction of the layout is necessary because either the wiring density or the wiring perimeter length is too large, and the height variation cannot be solved by inserting dummy wirings.

FIG. 15 is an explanatory diagram for a specific example of a data structure of the dummy fill rule set. The dummy fill rule set includes a rule number for identifying a dummy fill rule, the maximum wiring density and the maximum wiring perimeter length resulting from application of the dummy fill rule, a shape of a dummy wiring, an arrangement pattern, an interval between dummy wirings, and an interval between a genuine wiring and a dummy wiring. In the example in FIG. 15 defines that the shape of the dummy wiring is a square of 500×500, dummy wirings are arranged at positions (0, 15) and (85, 100), a spacing between the dummy wirings is 500, and a spacing between a dummy wiring and a genuine wiring is 1000.

By making the optimum rule selecting apparatus 20 select the dummy fill rule to be applied to a critical mesh as described, a layout evaluation and information that supports correction of a layout pattern can be provided.

Insertion of a dummy wiring may be automated by using an output from the optimum rule selecting apparatus 20.

Figure 16:
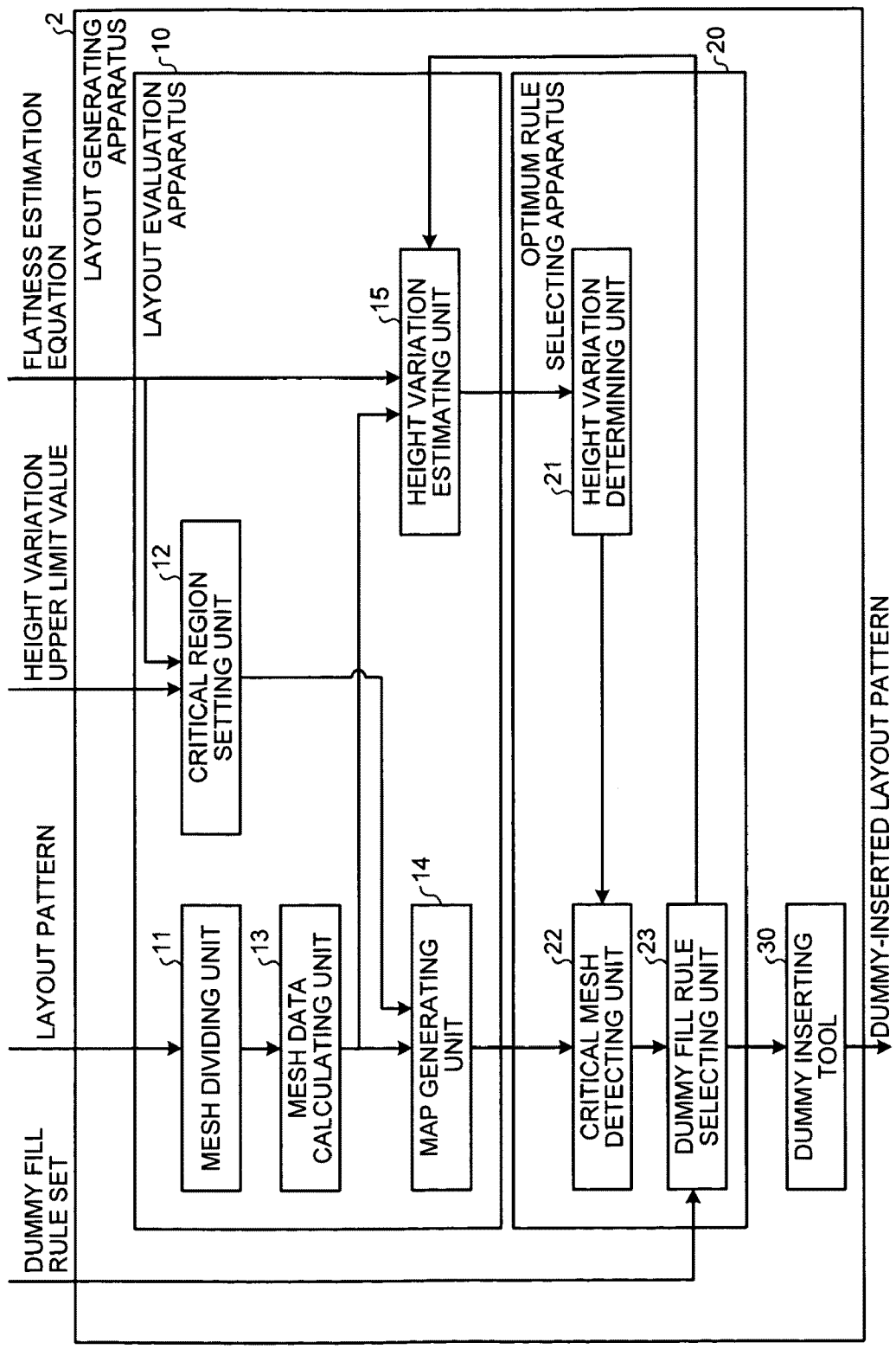
FIG. 16 is a schematic diagram of a configuration of a layout generating apparatus that performs dummy insertion.

A layout generating apparatus 2 illustrated in FIG. 16 includes a dummy inserting tool 30 that inserts a dummy wiring using the output from the optimum rule selecting apparatus 20, i.e., a critical mesh to be subjected to insertion of dummy fills and a dummy fill rule to be applied to the critical mesh. The dummy inserting tool 30 that inserts a dummy wiring may employ existing techniques.

Because the layout generating apparatus 2 is able to perform insertion of dummy wirings after evaluation of an input layout pattern, a layout pattern that has been inserted with dummy wirings can be obtained as an output of the apparatus.

FIG. 17 is a table comparing the rule-based insertion of dummy fills using the criticality map obtained by the layout evaluation apparatus 10, a conventional rule-based insertion of dummy fills, and a model-based insertion of dummy fills.

As listed in FIG. 17, in the rule-based insertion of dummy fills using the criticality map, optimization of a layout pattern can be realized equally to the model-based insertion of dummy fills, by providing a plurality of dummy fill rules, and selecting a rule to be used for each mesh.

Because the flatness of a layout pattern can be estimated at the time of generating the criticality map, and a CMP simulation is not performed, the increase in the TAT can be suppressed to several percent with respect to the conventional rule-based insertion of dummy fills.

Furthermore, because the rule and the criticality map are obtained as the output, information sharing between the designing stage and the manufacturing stage is easy.

As explained above, the layout evaluation apparatus 10, the layout support apparatus 1, and the layout generating apparatus 2 according to the first embodiment evaluate the flatness of each circuit layout at high-speed, and thus can support the insertion of dummy fills.

The present embodiment is merely an example, and the present invention can be embodied with various modifications as appropriate without being limited to the embodiment. For example, the processing order of the mesh data calculation and the critical region setting can be modified as appropriate. By realizing each apparatus disclosed in the present embodiment and its components with software, a layout evaluation program that causes a computer perform the layout evaluation can be obtained.

[b] Second Embodiment

The first embodiment is described for a dummy fill performed based on the density and the edge length. However, because calculation of the edge length requires a longer time than calculation of the density, a dummy fill requires a longer time as the circuit size increases.

Time required for calculation depends on the layout. For example, while a dummy fill when performed not based on the edge length but on the density completes in about 20 minutes, the same dummy fill when performed based on both the density and the edge length may require 3 hours and 20 minutes, i.e., the latter may take ten times as long as the former.

Therefore, if the layout is corrected multiple times and a dummy fill is redone every time a correction is made, an increase in the processing time for calculating the edge length may be considerable.

As a second embodiment of the present invention, an embodiment avoiding an increase in the processing time for calculating the edge length while maintaining flatness achieved by CMP will be disclosed.

Figure 18:
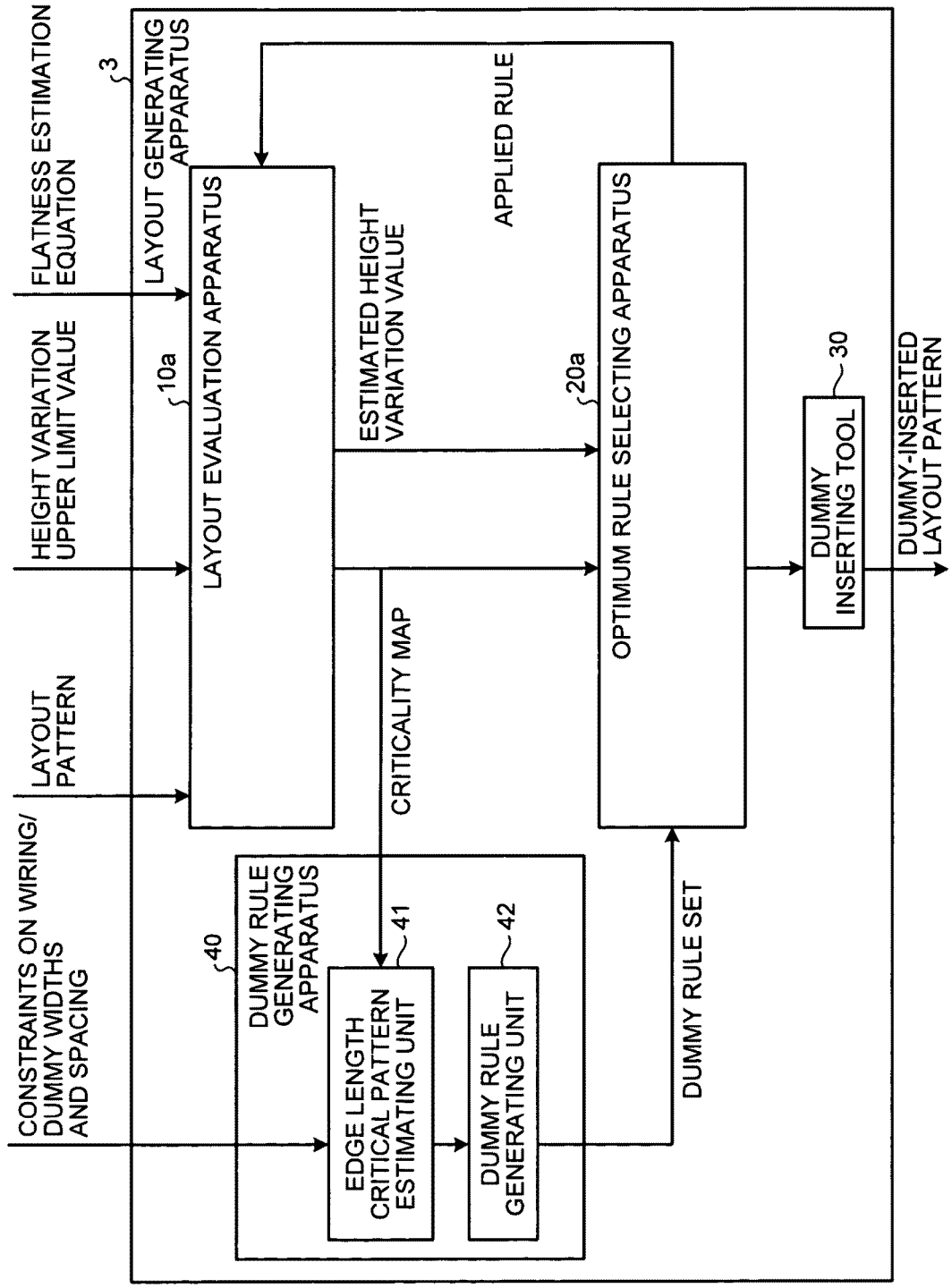
FIG. 18 is a diagram of a configuration of a layout generating apparatus according to a second embodiment of the invention.

FIG. 18 is a diagram of a configuration of a layout generating apparatus 3 according to the second embodiment. As illustrated in FIG. 18, the layout generating apparatus 3 includes therein a layout evaluation apparatus 10a, an optimum rule selecting apparatus 20a, the dummy inserting tool 30, and a dummy rule generating apparatus 40.

The dummy rule generating apparatus 40 generates dummy rules based on wiring and dummy widths, spacing constraints, and a criticality map. The criticality map is generated by the layout evaluation apparatus 10a in the same manner as in the first embodiment.

The dummy rule generating apparatus 40 includes therein an edge length critical pattern estimating unit 41 and a dummy rule generating unit 42. The edge length critical pattern estimating unit 41 determines a wiring pattern in which the edge length is smaller than an appropriate range as an edge length critical pattern based on the wiring and dummy widths, the spacing constraints, and the criticality map. This edge length critical pattern is determined for each of a plurality of density sub-ranges into which a density range applicable to wirings is divided. The edge length critical pattern is also determined for each wiring layer of the circuit layout.

The dummy rule generating unit 42 generates dummy fill rules of the shape and the layout of dummy metals that increase the number of dummy metals inserted in an edge length critical pattern and decrease the number of dummy metals inserted in a wiring pattern whose total perimeter length of wirings is within an appropriate range, that is, the edge length is not critical. The dummy rule generating unit 42 obtains a dummy fill rule for each wiring layer of the circuit layout and for each density sub-range.

The dummy rule generating apparatus 40 outputs a dummy fill rule for each wiring layer of the circuit layout and for each density sub-range that the dummy rule generating unit 42 generates to the optimum rule selecting apparatus 20a as a dummy rule set.

Figure 19:
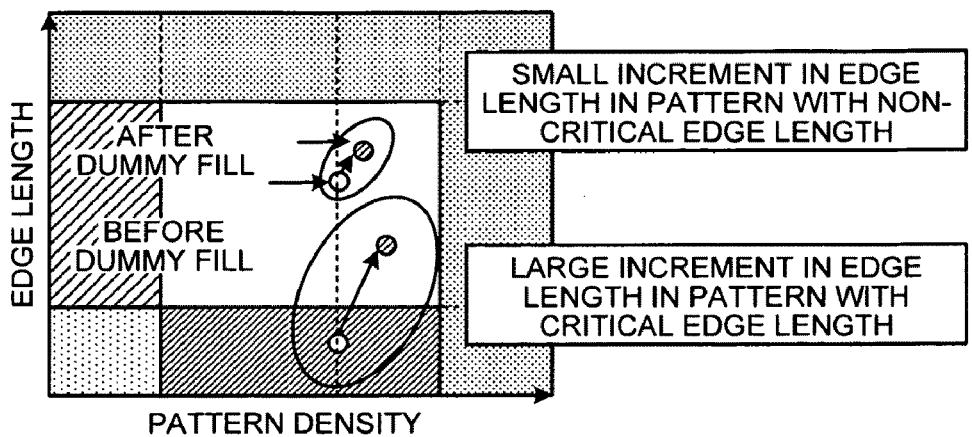
FIG. 19 is an explanatory diagram for dummy fill rules generated by a dummy rule generating unit.

FIG. 19 is an explanatory diagram for dummy fill rules generated by the dummy rule generating unit 42. The dummy rule generating unit 42 determines the shape and the size of dummy fills that promote an increase in the edge length in a pattern whose edge length is critical and suppress an increase in the edge length in a pattern whose edge length is originally non-critical under the same density. This means the edge length can be taken into account in selecting a dummy fill rule only based on density information. This dummy fill rule, therefore, requires no calculation of the edge length.

Figure 20:
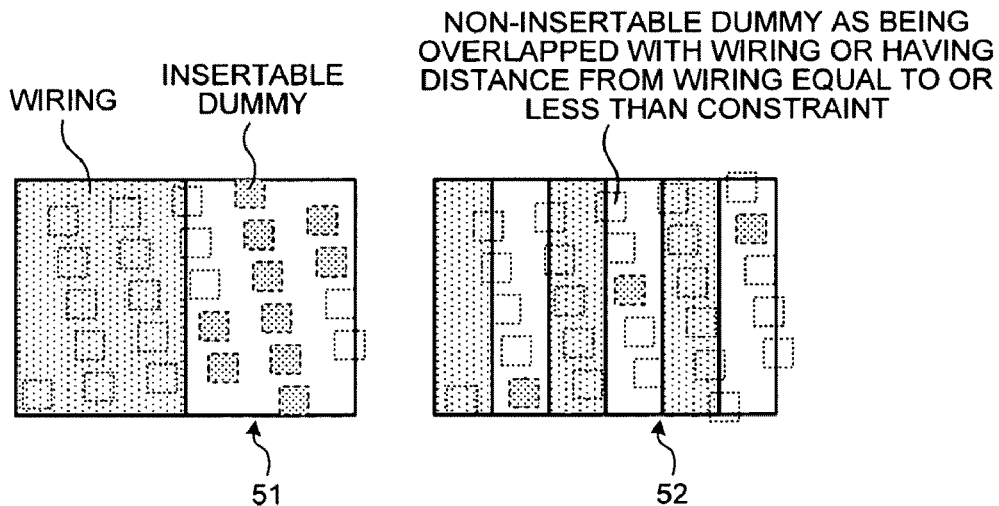
FIG. 20 is an explanatory diagram for changes in the number of dummy metals inserted depending on density.

What dummy fill rule eliminates the need of the calculation of the edge length will be described referring to FIG. 20. FIG. 20 is an explanatory diagram for changes in the number of dummy metals inserted depending on the density. A wiring pattern 51 and a wiring pattern 52 illustrated in FIG. 20 have the same density and different edge lengths. More specifically, the wiring pattern 51 has a large wiring width and a large wiring spacing; therefore, its edge length is critical. By contrast, the wiring pattern 52 has a small wiring width and a small wiring spacing; therefore, its edge length is non-critical.

If the same dummy fill rule is applied to the wiring patterns 51 and 52, because the wiring pattern 51 whose edge length is critical has a large space into which a dummy metal is inserted, ten squire dummy metals are inserted in the example illustrated in FIG. 20. By contrast, the wiring pattern 52 whose edge length is non-critical has a divided, thus small space into which a dummy metal is inserted. As a result, three square dummy metals are inserted in the example illustrated in FIG. 20.

In this manner, the dummy rule generating apparatus 40 generates dummy fill rules that make an increment in the wiring length large with more dummy metals inserted in a pattern whose edge length is critical, and an increment in the edge length small with fewer dummy metals inserted in a pattern whose edge length is non-critical even if the wiring patterns have the same wiring density.

In other words, the dummy rule generating apparatus 40 generates dummy fill rules that can take both the density and the edge length into account while density information alone is input. More specifically, the dummy rule generating apparatus 40 generates dummy fill rules depending on the density for each technology and for each wiring layer.

Specifically, the edge length critical pattern estimating unit 41 determines the ranges of the wiring width and of the wiring spacing to make the edge length critical for each wiring layer and for each density according to density information for basic layout patterns based on the minimum line width and spacing and the maximum wiring width specified in a design rule.

More specifically, the edge length critical pattern estimating unit 41 obtains $e_{min}$, $e_{max}$, $d_{min}$, $d_{max}$ representing ranges of the wiring density and the edge length that achieve flatness criticality based on the criticality map described in the first embodiment to be used for determining ranges of the wiring width and the wiring spacing that make the edge length critical for each wiring layer and for each density. Constraints on the wiring and dummy widths and spacing for each wiring layer are specified according to the design rule, process constraints, and the like.

The dummy rule generating unit 42 determines, within the ranges of the wiring width and the wiring spacing that make the edge length critical obtained by the edge length critical pattern estimating unit 41, the shape of dummy fills, a dummy size, and a dummy spacing that increase the edge length in a pattern whose edge length is critical and thus make the edge length non-critical.

By using this dummy fill rule, the optimum rule selecting apparatus 20a calculates only density information for each partial area based on an input layout pattern, thereby enabling insertion of dummy metals. After the dummy fill, the layout evaluation apparatus 10a may evaluate a height variation based only on density information.

FIG. 21 is an explanatory diagram for specific examples of dummy fill rules generated by the dummy rule generating apparatus 40. As listed in FIG. 21, dummy fill rules generated by the dummy rule generating apparatus 40 are set for each wiring layer and for each density sub-range.

Specifically, one dummy fill rule in FIG. 21 specifies that in a partial area whose wiring density is less than 20% on the first wiring layer, 0.6-square-micrometer square dummy metals are inserted at a spacing of 0.6 micrometer. Likewise, another dummy fill rule in FIG. 21 specifies that in a partial area whose wiring density is 20% to 50% on the first wiring layer, 0.5-square-micrometer square dummy metals are inserted at a spacing of 0.5 micrometer. Still another dummy fill rule in FIG. 21 specifies that in a partial area whose wiring density is 50% to 80% on the first wiring layer, 0.3-square-micrometer square dummy metals are inserted at a spacing of 0.2 micrometer.

Another dummy fill rule in FIG. 21 specifies that in a partial area whose wiring density is less than 10% on the second wiring layer, 1.5-square-micrometer square dummy metals are inserted at a spacing of 0.6 micrometer. Likewise, another dummy fill rule in FIG. 21 specifies that in a partial area whose wiring density is 10% to 40% on the second wiring layer, 1.0-square-micrometer square dummy metals are inserted at a spacing of 0.5 micrometer. Still another dummy fill rule in FIG. 21 specifies that in a partial area whose wiring density is 40% to 80% on the second wiring layer, 0.5-square-micrometer square dummy metals are inserted at a spacing of 0.2 micrometer.

Figure 22:
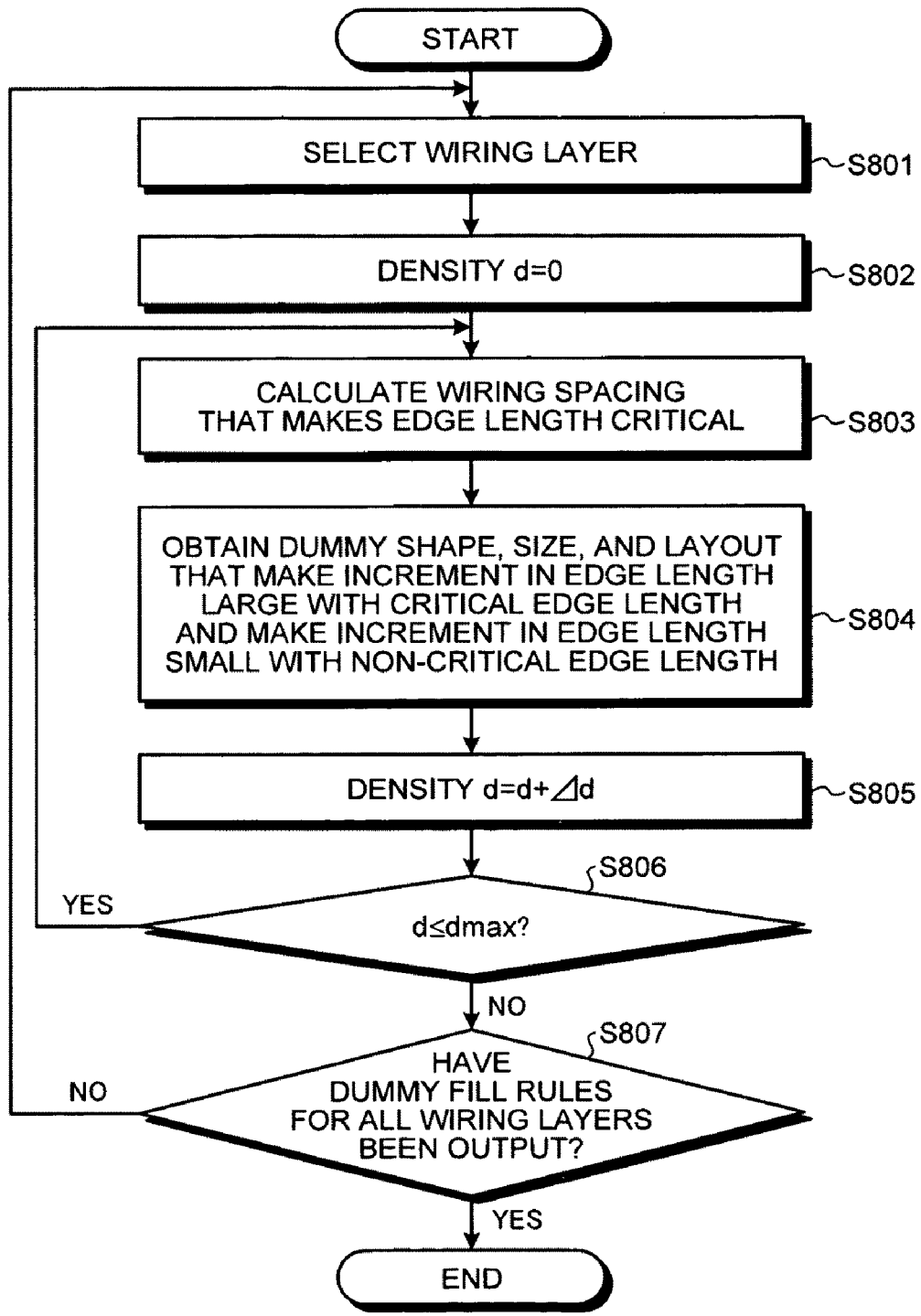
FIG. 22 is a flowchart for a processing operation of the dummy rule generating apparatus.

FIG. 22 is a flowchart for a processing operation of the dummy rule generating apparatus 40. To begin with, the dummy rule generating apparatus 40 selects a wiring layer (Step S801) and sets a density d as zero (Step S802).

The edge length critical pattern estimating unit 41 calculates a wiring spacing that makes the edge length critical with the wiring layer and the density thus selected (Step S803). Subsequently, the dummy rule generating unit 42 obtains the dummy shape, size, and layout that make an increment in the edge length large when the edge length is critical and make an increment in the edge length small when the edge length is non-critical with respect to the wiring spacing thus calculated (Step S804).

Subsequently, the dummy rule generating apparatus 40 adds the density d to a predetermined amount $\Delta d$ (Step S805). The amount $\Delta d$ added to the density can be set in advance. The dummy rule generating apparatus 40 compares the density with an addition of $\Delta d$ with a maximum density $d_{max}$. If $d \leq d_{max}$ (Yes at Step S806), the process returns to Step S803.

If the density d exceeds the maximum density $d_{max}$ (No at Step S806), the dummy rule generating apparatus 40 determines whether dummy fill rules for all the wiring layers have been output (Step S807). As a consequence, if there remains a wiring layer for which no dummy fill rule has been output (No at Step S807), the dummy rule generating apparatus 40 returns to selection of a wiring layer (S801). If dummy fill rules have been generated for all the wiring layers (Yes at Step S807), the dummy rule generating apparatus 40 completes the process.

A specific example of calculation of a wiring spacing that makes the edge length critical will now be described. Assuming that d represents a wiring density and e represents an edge length, based on the critical map, the wiring density is critical if $d<d_{min}$, and the edge length is critical if $e<e_{min}$.

Constraints on a wiring width $l_w$ and a wiring spacing $s_p$ are set as:

$l_{min} \leq l_w \leq l_{max}$ and $s_{pmin} \leq s_p$, respectively.

Figure 23:
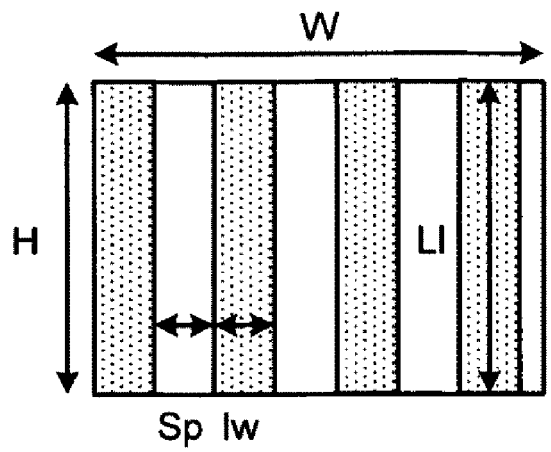
FIG. 23 is a diagram of a specific example of a layout pattern in which wirings of an equal width are arranged at regular intervals.

FIG. 23 is a diagram of a specific example of a layout pattern in which wirings of an equal width are arranged at regular intervals. $l_w$ represents a wiring width, $s_p$ represents a wiring spacing, and $l_l$ represents the length of the wiring itself. The layout pattern illustrated in FIG. 23 is a mesh cut out from the whole layout in a grid pattern having a height of H and a width of W. The length $l_l$ of the wiring itself equals to the vertical width of the mesh in FIG. 23, that is, $l_l$=H.

In the layout pattern illustrated in FIG. 23, the density d is calculated by $$d = \frac{l_w}{s_p + l_w}, \tag{1}$$

and the edge length e is calculated by $$e = \frac{2 \cdot (l_w + H) \cdot W}{s_p + l_w} \quad (2)$$

The edge length is further calculated based on the density and a wiring spacing by $$e = \frac{2(d \cdot s_p + (1-d) \cdot H)}{s_p} \cdot W \quad (3)$$

Assuming that the range in which the edge length is critical is $e<e_{min}$, a lower limit $s_{th}$ of the wiring spacing $s_p$ for making the edge length critical is calculated by $$s_p \geq s_{th} = 2HW \cdot \frac{l-d}{e_{min} - 2Wd} \quad (4)$$

For example, if H=W=100, the density is 50%, and $e_{min}$=5000, the lower limit $s_{th}$ of the wiring spacing for making the edge length critical is calculated by $$s_p \geq s_{th} = 2HW \cdot \frac{l-d}{e_{min} - 2Wd} = \frac{10000}{4900} \approx 2.04 \quad (5)$$

Accordingly, the edge length of a mesh with a density of 50% is critical in a pattern with a wiring spacing of equal to or more than 2.04.

If H=W=20, the density is 50%, and $e_{min}$=500, the lower limit $s_{th}$ of the wiring spacing for making the edge length critical is calculated by $$s_p \geq s_{th} = 2HW \cdot \frac{l-d}{e_{min} - 2Wd} = \frac{400}{480} \approx 0.83 \quad (6)$$

Accordingly, the edge length of a mesh with a density of 50% is critical in a pattern with a wiring spacing of equal to or more than 0.83.

A specific example will now be described on calculating a dummy width and a dummy spacing that make no dummies be inserted in a pattern whose edge length is critical, that is, in a pattern whose wiring spacing is equal to or less than $s_{th}$.

An arrangement in which the dummy shape is square and the dummy layout is in parallel with wirings will now be described. The dummy shape is set to be square and a spacing $s_s$ between wirings and dummy metals is set to be 0.7 in advance. In the example mentioned above under H=W=100, a 50% density, and $e_{min}$=5000, because the lower limit $s_{th}$ of the wiring spacing for making the edge length critical is 2.04, $$d_w > s_{th} - 2 \cdot s_d = 2.04 - 0.7 \times 2 = 0.64 \quad (7)$$

Figure 24:
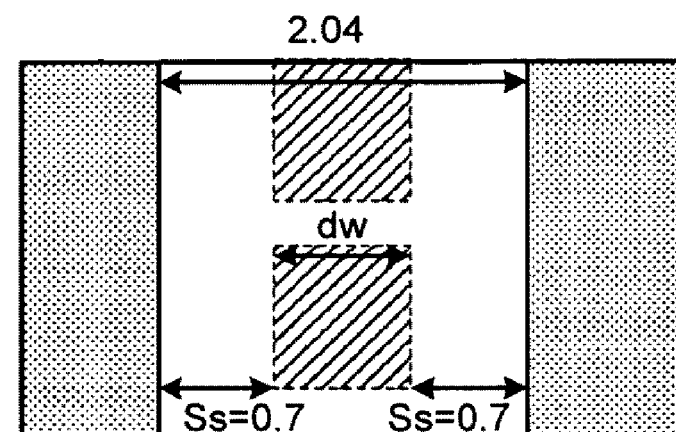
FIG. 24 is an explanatory diagram for a relationship between the insertion of dummy metals and wiring spacing.

Assuming that a side $d_w$ of the dummy metal is the minimum value that satisfies Formula 7 with a 0.1 interval, $d_w$=0.7. Therefore, as illustrated in FIG. 24, no dummy metals with $d_w \geq 0.7$ are inserted in a pattern whose edge length is non-critical, that is, in a pattern whose wiring spacing is equal to or less than 2.04.

Assuming that the dummy shape is set to be square and the spacing $s_s$ between wirings and dummy metals is set to be 0.7 in advance, in the example mentioned above under H=W=20, a density of 50%, and $e_{min}$=500, because the lower limit $s_{th}$ of the wiring spacing for making the edge length critical is 0.83, $$d_w > s_{th} - 2 \cdot s_s = 0.83 - 0.7 \times 2 = -0.57 \quad (8)$$

In this case, in a pattern whose edge length is non-critical, that is, in a pattern whose wiring spacing is equal to or less than 0.83, no dummy metals are inserted due to constraints on the spacing between dummy metals and wirings.

Figure 25:
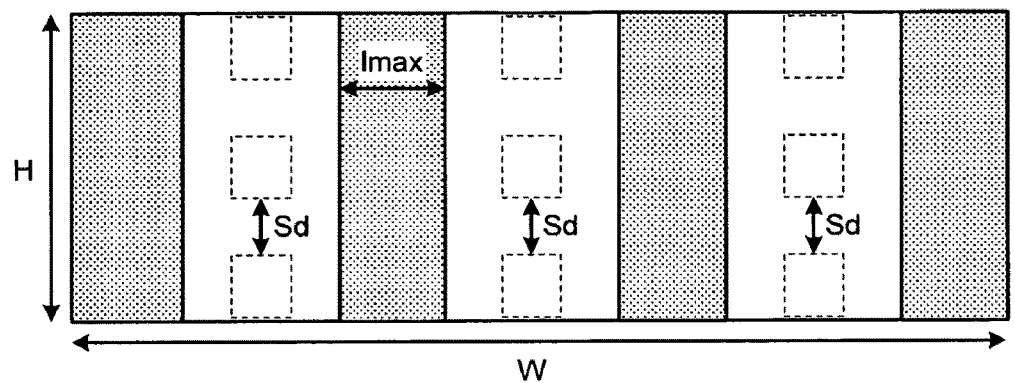
FIG. 25 is an explanatory diagram for determination of dummy spacing.

Determination of the dummy spacing $s_d$ will now be described with reference to FIG. 25. The minimum increment in the edge length with a line of dummy inserted in a pattern whose edge length is critical is calculated by:

$$\Delta e \approx 4d_w \cdot \left(\frac{HW}{d_w + s_d}\right) \cdot \frac{d}{l_{max}} \quad (9)$$

Accordingly, in the example mentioned above under H=W=100, a 50% density, and $e_{min}$=5000, assuming that the lower limit $s_{th}$ of the wiring spacing for making the edge length critical is 2.04, and the density is 50% (d=0.5), $\Delta e$=15000, and $l_{max}$=0.5, the dummy spacing $s_d$ is calculated by $$s_d = \frac{4d_w \cdot HW}{\Delta e} \cdot \frac{d}{l_{max}} - d_w \quad (10)$$

$$= \frac{4 \times 0.7 \times 10000}{15000} \cdot \frac{0.5}{0.5} - 0.7$$

$$= 1.17$$

In the example mentioned above under H=W=20, a 50% density, and $e_{min}$=500, assuming that the density is 50% (d=0.5), $\Delta e$=1000, $l_{max}$=0.5, and a dummy width, which can be set optionally, is 0.2, the dummy spacing $s_d$ is calculated by $$s_d = \frac{4d_w \cdot HW}{\Delta e} \cdot \frac{d}{l_{max}} - d_w \quad (11)$$

$$= \frac{4 \times 0.2 \times 400}{1000} \cdot \frac{0.5}{0.5} - 0.2$$

$$= 0.12$$

Figure 26:
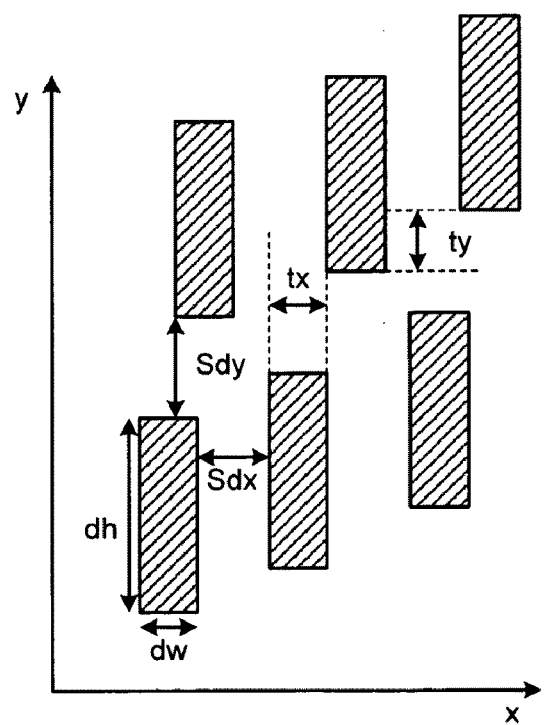
FIG. 26 is an explanatory diagram for rectangular dummy metals.

Referring next to FIG. 26, an arrangement in which dummy metals are rectangular-shaped and arranged in a zigzag pattern will be described. The shape of dummy metals is defined by a short side $d_w$, which is set for square dummies, and a long side obtained by multiplying the short side by a constant number. The dummy spacing is defined by calculating a spacing $s_{dx}$ in the short side direction in a similar manner to that of square dummies, and by multiplying the spacing in the short side direction by a constant number to obtain a dummy spacing in the long side direction. The dummy metals are arranged with a gap $t_x$ in the short side direction and a gap $t_y$ in the long side direction therebetween.

Assuming that $\alpha$ and $\beta$ represent constant numbers ($\alpha > 0$, $\beta > 0$), $p_x$ represents the number of dummies in the x direction, and $p_y$ represents the number of dummies in the y direction, the following formulas hold true:

$$d_h = \alpha \times d_w (l_{min} \leq d_h \leq l_{max}),$$

$$s_{dy} = \beta \times S_{dx} (s_{pmin} \leq s_{dy}),$$

$t_x = (d_w + s_{dx})/p_x$, and $t_y = (d_h + s_{dy})/p_y$.

If $\alpha=2$, $\beta=1$, $p_x=3$, and $p_y=2$, in the example mentioned above under H=W=100, a 50% density, and $e_{min}$=5000, because the lower limit $s_{th}$ of the wiring spacing for making the edge length critical is 2.04, $d_w$ is 0.7 in the same manner as that of square dummies.

Therefore, $d_h$ is calculated by $$d_h = 2 \times d_w = 1.4$$

Subsequently, $s_{dy}$ and $s_{dx}$ are calculated. An increment in the edge length is calculated by $$\Delta e \approx 2(d_w + d_h) \cdot \left( \frac{HW}{p_y \cdot (d_h + s_{dy})} \right) \cdot \frac{d}{l_{max}} \quad (12)$$

Assuming that $\Delta e$=15000 and $l_{max}$=0.5, the dummy spacing $s_{dy}$ is calculated by $$\begin{aligned} s_{dy} &= \frac{2(d_w + d_h) \cdot HW}{\Delta e \cdot p_y} \cdot \frac{d}{l_{max}} - d_h \\ &= \frac{2 \times (0.7 + 1.7) \times 10000}{15000 \cdot 2} \cdot \frac{0.5}{0.5} - 0.7 \\ &= 0.7 \end{aligned} \quad (13)$$

Accordingly, the following formulas hold true:

$s_{dx} = s_{dy} = 0.7$, $t_x = (d_w + s_{dx})/3 = (0.7 + 0.7)/3 = 0.47$, and $t_y = (d_h + s_{dy})/2 = (0.7 + 1.4)/2 = 1.05$ In the example mentioned above under H=W=20, a 50% density, and $e_{min}$=500, assuming that dw, which can be set optional in a similar calculation manner to that of square dummies, is 0.2, $d_h = 2 \times d_w = 0.4$.

Assuming that $\Delta e$=1000 and $l_{max}$=0.5, the dummy spacing sdy is calculated by $$\begin{aligned} s_{dy} &= \frac{2(d_w + d_h) \cdot HW}{\Delta e \cdot p_y} \cdot \frac{d}{l_{max}} - d_h \\ &= \frac{2 \times (0.2 + 0.4) \times 400}{1000 \cdot 2} \cdot \frac{0.5}{0.5} - 0.4 \\ &= -0.46 \end{aligned} \quad (14)$$

With $s_{dy}$ of an optional value, an increment in the edge length reaches or exceeds 1000. In this case, $s_{dy}$ equals to $s_{pmin}$. $s_{pmin}$ is the maximum spacing, and specified by an input design rule. Assuming that $s_{pmin}$ is 0.2, the following formulas hold true:

$s_{dy} = s_{dx} = 0.2$, $t_x = (d_w + s_{dx})/3 = (0.2 + 0.2)/3 = 0.13$, and $t_y = (d_h + s_{dy})/2 = (0.4 + 0.2)/3 = 0.2$ According to the second embodiment as mentioned above, dummy rules that make an increment in the edge length large in a pattern whose edge length is critical are obtained, whereby a dummy fill taking the edge length into account is performed without the calculation of the edge length. Therefore, highly accurate layout evaluation can be performed in a short period of time.

In the description of the second embodiment, specific examples are given with a mesh in which wirings of an equal width are arranged at regular intervals. This is merely an example, and any optional patterns may be used for the calculation of dummy fill rules. In particular, basic patterns that frequently appear in an object layout are preferably used.

While in the second embodiment, examples are given with square and rectangular dummy metals, the shape and the layout of dummy metals can be modified as needed. Further, while examples are given with the layout generating apparatus in a third embodiment of the present invention, it should be noted that the embodiment is also applicable to a layout support apparatus in the same manner as in the first embodiment.

In addition, the dummy rule generating apparatus disclosed in the second embodiment may be embodied in the form of a computer program operating on a computer.

The apparatuses and the programs according to some aspects of the present invention advantageously provide a layout evaluation apparatus, a layout evaluation program, a dummy rule generating apparatus, and a dummy rule generating program that carry out flatness evaluation for each circuit layout at a high speed and thus support a dummy fill.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A dummy rule generating apparatus comprising:
a critical pattern estimating unit that determines a wiring pattern whose total perimeter length of wirings is smaller than an appropriate range based on constraints on the wirings for a circuit layout as a critical pattern, and
a rule generating unit that generates dummy fill rules of a shape and a layout of dummy metals that increase number of dummy metals inserted in the critical pattern and decrease the number of dummy metals inserted in a wiring pattern whose total perimeter length of wirings is within an appropriate range.

2. The dummy rule generating apparatus according to claim 1, wherein the critical pattern estimating unit obtains the critical pattern for each wiring density, and the rule generating unit obtains the dummy fill rule for each wiring density.

3. The dummy rule generating apparatus according to claim 1, wherein the critical pattern estimating unit obtains the critical pattern for each wiring layer of the circuit layout, and the rule generating unit obtains the dummy fill rule for each wiring layer of the circuit layout.

4. The dummy rule generating apparatus according to claim 1, wherein the critical pattern estimating unit obtains the critical pattern by using a map on which partial area data on partial areas obtained by dividing the circuit layout, and a critical region indicating a wiring density and a total perimeter length of wirings in which a height variation after planarization is larger than an upper limit are plotted.

5. The dummy rule generating apparatus according to claim 1, wherein the rule generating unit determines the shape of the dummy metals to be a rectangle at least one of whose side lengths is larger than a length obtained by subtracting a spacing between the wirings and the dummy metals from a wiring spacing in the critical pattern.

6. A dummy rule generating method comprising:
obtaining a writing pattern in which a perimeter length of wirings is smaller than an appropriate range based on constraints on wirings for a circuit layout as a critical pattern; and
generating, by a computer, dummy fill rules of a shape and a layout of dummy metals that increase number of dummy metals inserted in the critical pattern and decrease the number of dummy metals inserted in a wiring pattern whose total perimeter length of wirings is within an appropriate range.

7. A non-transitory computer readable storage medium having stored therein a dummy rule generating program, the dummy rule generating program causing a computer to execute a process comprising:
obtaining a wiring pattern in which a perimeter length of wirings is smaller than an appropriate range based on constraints on wirings for a circuit layout as a critical pattern; and
generating dummy fill rules of a shape and a layout of dummy metals that increase number of dummy metals inserted in the critical pattern and decrease the number of dummy metals inserted in a wiring pattern whose total perimeter length of wirings is within an appropriate range.

* * * * *